United States Patent
Li et al.

(10) Patent No.: US 11,892,532 B2
(45) Date of Patent: Feb. 6, 2024

(54) WHOLE-BLADE ACQUISITION AND PHASE CORRECTION IN MAGNETIC RESONANCE IMAGING

(71) Applicant: Dignity Health, San Francisco, CA (US)

(72) Inventors: Zhiqiang Li, San Francisco, CA (US); John P. Karis, San Francisco, CA (US)

(73) Assignee: Dignity Health, San Francisco, CA (US)

( * ) Notice: Subject to any disclaimer, the term of this patent is extended or adjusted under 35 U.S.C. 154(b) by 0 days.

(21) Appl. No.: 18/006,108

(22) PCT Filed: Jul. 22, 2021

(86) PCT No.: PCT/US2021/042810
§ 371 (c)(1),
(2) Date: Jan. 19, 2023

(87) PCT Pub. No.: WO2022/020614
PCT Pub. Date: Jan. 27, 2022

(65) Prior Publication Data
US 2023/0243908 A1  Aug. 3, 2023

Related U.S. Application Data

(60) Provisional application No. 63/054,972, filed on Jul. 22, 2020.

(51) Int. Cl.
*G01G 3/00* (2006.01)
*G01R 33/48* (2006.01)
(Continued)

(52) U.S. Cl.
CPC ...... *G01R 33/4824* (2013.01); *G01R 33/5611* (2013.01); *G01R 33/56341* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

2010/0188085 A1* 7/2010 Huo .................. G01R 33/4824
324/309
2011/0241671 A1  10/2011 Zhao et al.
(Continued)

FOREIGN PATENT DOCUMENTS

CA         2964945 A1 * 10/2017 ........... G01R 33/443
WO   WO-2016187015 A1 * 11/2016 ......... G01R 33/4824

OTHER PUBLICATIONS

KR 101625557 B1 (스테머, 알토 ) (Year: 2013).*
(Continued)

*Primary Examiner* — Walter L Lindsay, Jr.
*Assistant Examiner* — Frederick Wenderoth
(74) *Attorney, Agent, or Firm* — Polsinelli PC

(57) ABSTRACT

Various embodiments of a system and associated method for whole-blade acquisition and phase correction for fast and robust MR imaging are disclosed herein. In particular, the system enables sampling of odd and even k-space echoes in the same k-space as well as a whole-blade phase correction strategy to achieve improved image quality at an accelerated imaging rate.

30 Claims, 24 Drawing Sheets

(51) Int. Cl.
   *G01R 33/561*  (2006.01)
   *G01R 33/563*  (2006.01)
(58) Field of Classification Search
   USPC .......................................................... 324/309
   See application file for complete search history.

(56) References Cited

U.S. PATENT DOCUMENTS

| | | | |
|---|---|---|---|
| 2011/0254548 A1* | 10/2011 | Setsompop | ........ G01R 33/4835 |
| | | | 324/309 |
| 2014/0043024 A1 | 2/2014 | Gui et al. | |
| 2017/0067977 A1 | 3/2017 | Schar et al. | |

OTHER PUBLICATIONS

Patent Cooperation Treaty, International Search Report and Written Opinion, International Application No. PCT/US2021/042810, 10 pages.

* cited by examiner (b) sub-blade phase correction between GRE and SE (c) whole-blade phase correction

WHOLE-BLADE ACQUISITION AND PHASE CORRECTION IN MAGNETIC RESONANCE IMAGING

FIELD

The present disclosure generally relates to magnetic resonance (MR) imaging, and in particular, to a system and associated method for improved whole-blade imaging data acquisition and phase correction in MR imaging.

BACKGROUND

Magnetic Resonance Imaging (MRI) technology images various tissues within the body by subjecting protons to an external magnetic field, thereby causing the protons to align with the external magnetic field. A radiofrequency (RF) pulse is then introduced which forces the protons to move either 90 or 180 degrees out of alignment with the external magnetic field. When the RF pulse is turned off, the protons will snap back into alignment with the external magnetic field such that energy released by these protons can be measured and used to differentiate materials. Specifically, some nuclei, hydrogen in particular, can absorb RF energy when in an external magnetic field. Resultant evolving spin polarization from the nuclei can induce an RF signal, often referred to as an "echo", in a radiofrequency coil that can thereby be detected. Pulses of radio waves can excite the nuclei and cause the nuclei to produce an electromagnetic signal with a frequency characteristic of the magnetic field at the nucleus. By varying RF pulse sequence parameters, different contrasts can be generated within an MRI image between tissues based on relaxation properties of materials within a scanned object. To identify where in space each of these nuclei are, a magnetic field gradient is applied along the X, Y, and Z planes which introduces linear variations in the external magnetic field and allows spatial encoding of the RF signals induced in the radiofrequency coils by the nuclei.

Diffusion MRI has established itself as an important clinical tool in many neurological applications, such as the diagnosis and evaluation of stroke, multiple sclerosis, traumatic brain and spinal cord injuries, psychiatric and neurodegenerative disorders, and pre-surgical planning. In a clinical setting, single-shot echo-planar imaging (ss-EPI) is the prevalent method of choice due to its scan efficiency and insensitivity to patient motion; however, ss-EPI suffers from severe geometric distortion artifacts, and image blurring that results in limited spatial resolution. As a result, improving the fidelity and resolution of diffusion MRI is still of significant clinical relevance, especially for 1) detecting small lesions and delineating fine nerve structures, 2) evaluating diseases in areas around the skull base, brain stem, and post-surgical cavities, where distortion artifacts often render diffusion images non-diagnostic, and 3) advancing diffusion outside the head (the spinal cord), where diffusion methods are difficult or even impossible for routine clinical use due to many challenges such as spatial resolution, physiological motion, and distortions from strong susceptibility-induced field variations. Multi-shot EPI (ms-EPI) offers improved spatial resolution and partially reduces artifacts related to distortion, but at the cost of scan efficiency; however, ms-EPI is subject to patient motion-induced inter-shot phase errors, which must be corrected for and otherwise will cause severe motion artifacts. Unfortunately, successful correction of motion with ms-EPI is not always reliable in clinical settings. In contrast, fast spin-echo (FSE)-based diffusion MRI sequences are free from geometric distortions, but with limited clinical adoption, primarily due to their low scan efficiency. Therefore, a critical gap that undermines the clinical value and use of diffusion MRI is the clear lack of reliable, efficient, and robust pulse sequences that are amenable to diffusion imaging throughout the brain and spinal cord.

It is with these observations in mind, among others, that various aspects of the present disclosure were conceived and developed.

BRIEF DESCRIPTION OF THE DRAWINGS

Corresponding reference characters indicate corresponding elements among the view of the drawings. The headings used in the figures do not limit the scope of the claims.

DETAILED DESCRIPTION

Figure 1:
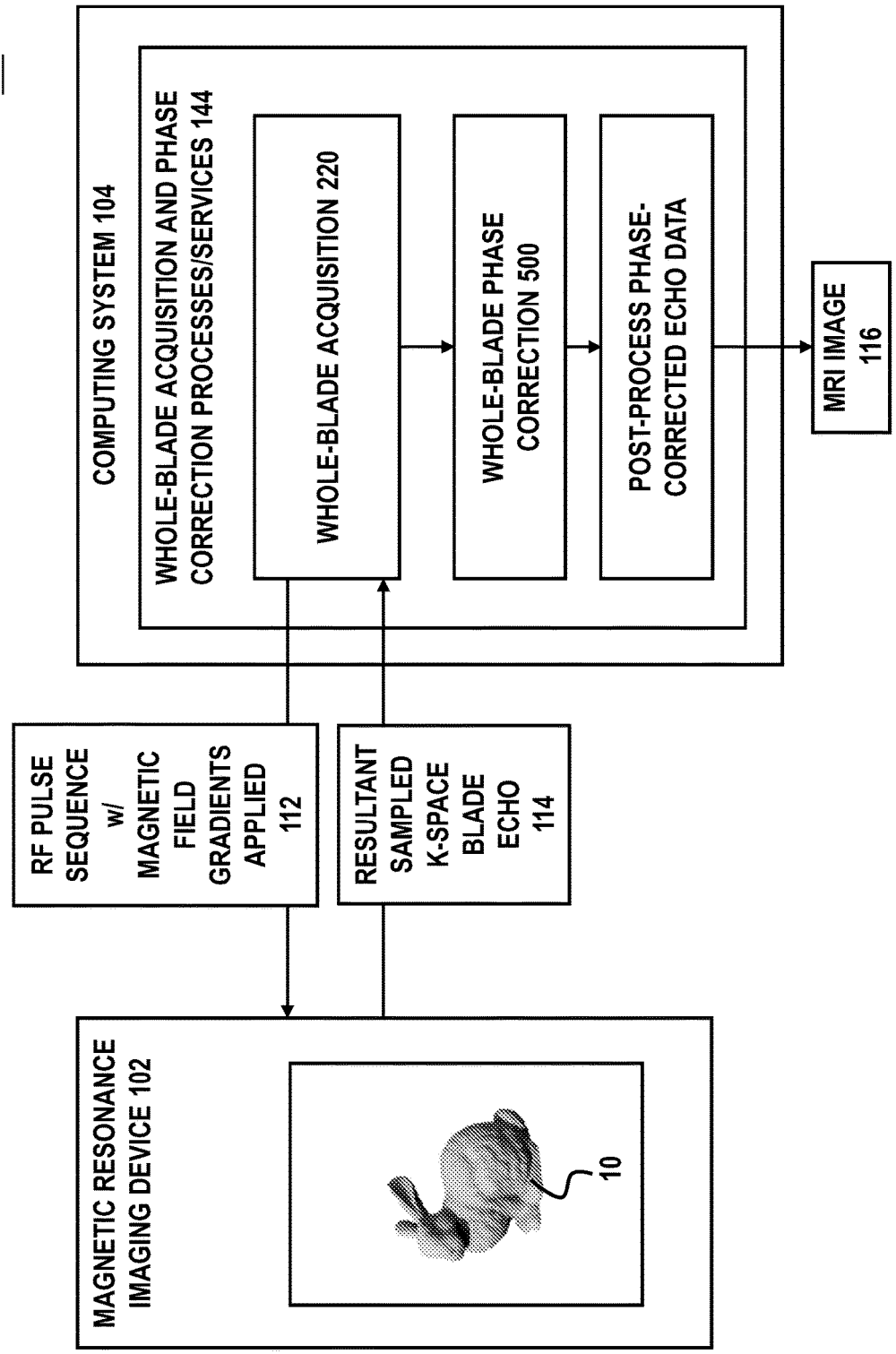
FIG. 1 is a simplified block diagram illustrating a system for producing an improved magnetic resonance (MR) image using a whole-blade acquisition and phase correction methodology.

Various embodiments of a system and associated methods for improved whole-blade acquisition and phase correction in magnetic resonance (MR) imaging are disclosed herein. An MR device applies an RF pulse sequence to an object for acquisition of MR data that results in a k-space representation of resonant frequencies, or "echoes" that are detected by the MR device due to different materials in the object responding to the RF pulse sequence. Odd and even echoes are collected in the same k-space to accelerate acquisition of MR data for faster sampling of the whole k-space. Further, odd and even spin-echo echoes are collected at the center of k-space to serve as calibration data, enabling the system to perform whole-blade phase correction on the entire k-space blade echo and provide a phase-corrected image taken at an accelerated rate. Referring to the drawings, embodiments of an MR system with whole-blade acquisition and phase correction are illustrated and generally indicated as 100 in FIGS. 1-18.

Magnetic Resonance (MR) Overview

Figure 2:
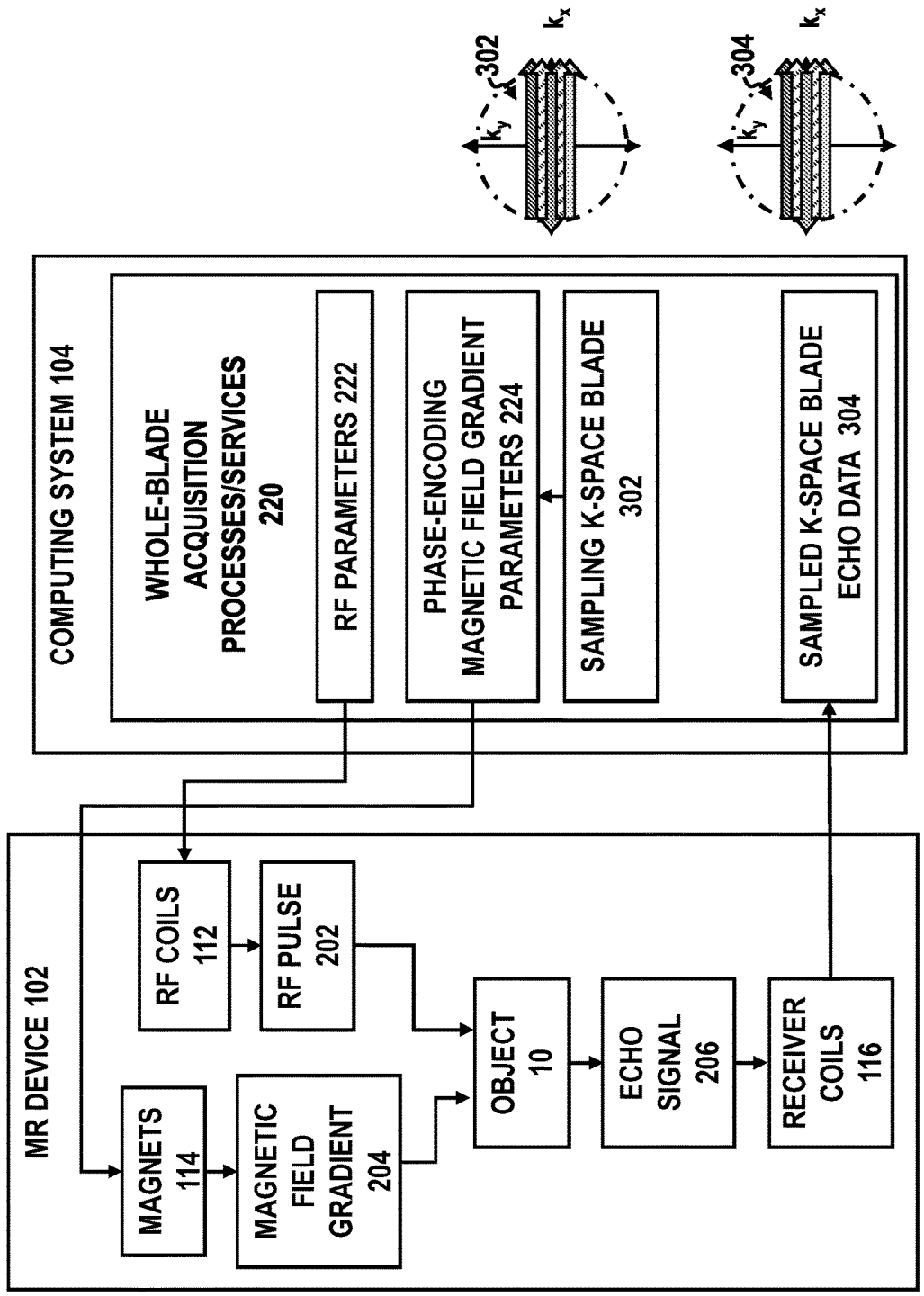
FIG. 2 is a simplified block diagram illustrating data flow for the system of FIG. 1.

Magnetic resonance imaging relies on excitation/relaxation properties of protons within an object 10 to obtain an image of the interior of the object. Referring to FIGS. 1 and 2, a system 100 is illustrated for MR imaging that includes an MR device 102 configured to apply a radiofrequency (RF) pulse sequence 202 with magnetic field gradients 204 to the object 10. In particular, the MR device 102 includes a plurality of RF coils 112 configured to apply the RF pulse sequence 202 to the object 10 according to RF parameters 222. The MR device 102 further includes a plurality of magnets 114 and associated hardware to induce a phase-encoding magnetic field gradient 204 that varies to excite protons within the object 10 under controlled circumstances based on a whole-blade k-space sampling arrangement described herein. The RF pulse sequence 202 involves a relaxation period in which the protons, having been subjected to the RF pulse sequence 202 and the magnetic field gradient 204, resonate as they return to their natural material states. During this relaxation period, an echo signal 206 including the resonant frequencies of relaxing protons within a voxel of the object 10, or "echoes", are recorded by a plurality of receiving coils 116 of the MR device 104 and encoded in the form of sampled k-space blade echo data 304 that includes sub-blade echo data. Differences in frequency of oscillation of protons in the object 10 or differing relaxing properties (T1, T2) can denote differences in material, and the magnetic field gradient 204 encodes a position of each detected frequency. The k-space blade echo data 234 can be subjected to further processing including a whole-blade phase correction pipeline 500 to correct for phase discrepancies and other distortions before finally being converted into a final image. In some embodiments, the system 100 can apply one or more post-processing techniques 150 to the final phase-corrected echo data.

Computing Device

The system 100 further includes a computing device 104 in communication with the MR device 102 for applying various image-processing techniques to acquired MR data to develop a final image and in some embodiments for providing one or more control parameters to the MR device 102. In particular, the computing device 104 can include one or more processor(s) 720 (FIG. 18) in association with a memory 740 including instructions which, when executed, cause the processor to perform one or more operations associated with whole-blade acquisition and phase correction processes/services 144. Whole-blade acquisition and phase correction processes/services 144 can be a standalone process or application or can be a collection of processes or applications that execute aspects of a whole-blade acquisition and phase correction method 400 disclosed herein.

Proton Excitation and k-space

Figure 3:
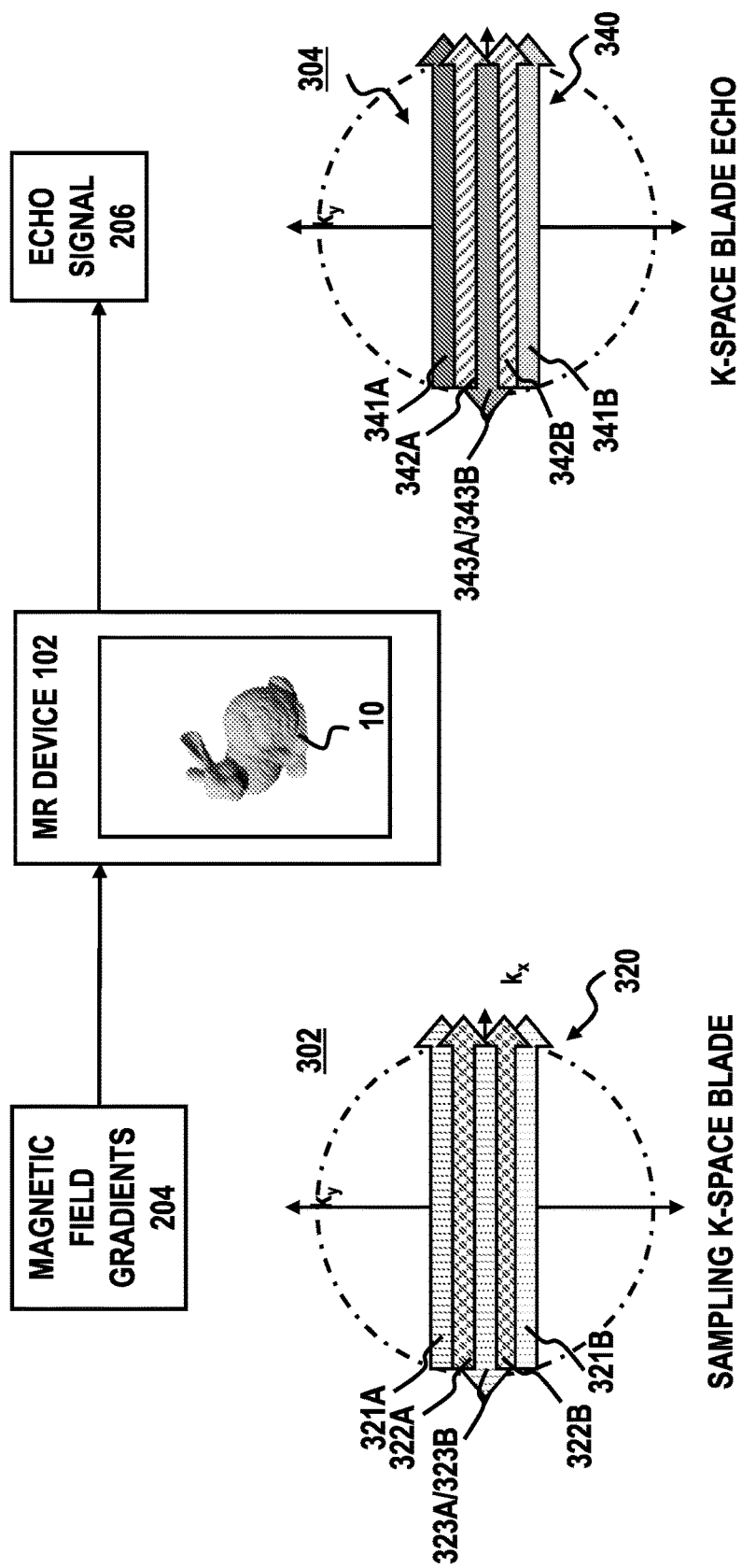
FIG. 3 is a simplified diagram showing a relationship between k-space blades and the signals applied to and acquired from an object being scanned by the system of FIG. 1.

Referring to FIGS. 2 and 3, the MR device 102 excites, or rotates, protons using an RF pulse sequence 202 with phase-encoding magnetic field gradients 204. The MR device 102 samples the resultant frequency data from the echo signal 206 from the protons within the object 10 as k-space "blade" echo data 234 that are sampled into a frequency-based k-space. To sample k-space blade echo data 234, a sampling k-space "blade" 302 defining specific magnetic field gradient parameters 224 for a plurality of sampling k-space sub-blades 320 of the sampling k-space blade 302 are applied to the object 10. Each sampling k-space blade 302 spans a section of k-space, as shown in FIG. 3, and produces resultant k-space blade echo data 340 that the MR device 102 collects. "Blades" and "sub-blades" are called such due to their resemblance in k-space to a blade such as a propeller blade or a knife. Sampled k-space blade echo data, hereinafter a "k-space blade echo" 304 is placed in the corresponding section of k-space during sampling of the entire k-space.

K-space is a representation of spatial frequency data that is inherent in the object 10 that is being scanned by the MR device 10. The k-space blade echo 304 includes data for an image taken by the MR device 10. The k-space blade echo 304 is a sampling cross-section in k-space which is related to image space by Fourier transform. In other words, the k-space blade echo is a frequency-domain representation of a feedback signal that is acquired when the RF pulse sequence is applied to particles in a scanned object 10 during MR imaging. In the example of FIGS. 6A-6D, the MR device 102 can sample the entirety of k-space to obtain an MR cross-sectional image of the object 10 by rotating the sampling k-space blade 302 about a center of k-space between samples in a radial sampling technique. In other embodiments, for enablement of a rectangular field of view, the MR device 102 can sample the entirety of k-space to obtain an MR cross-sectional image of the object 10 by a single sampling k-space blade or a special case of multi-rotating blades in a cartesian sampling technique.

K-space Blade

Figure 4:
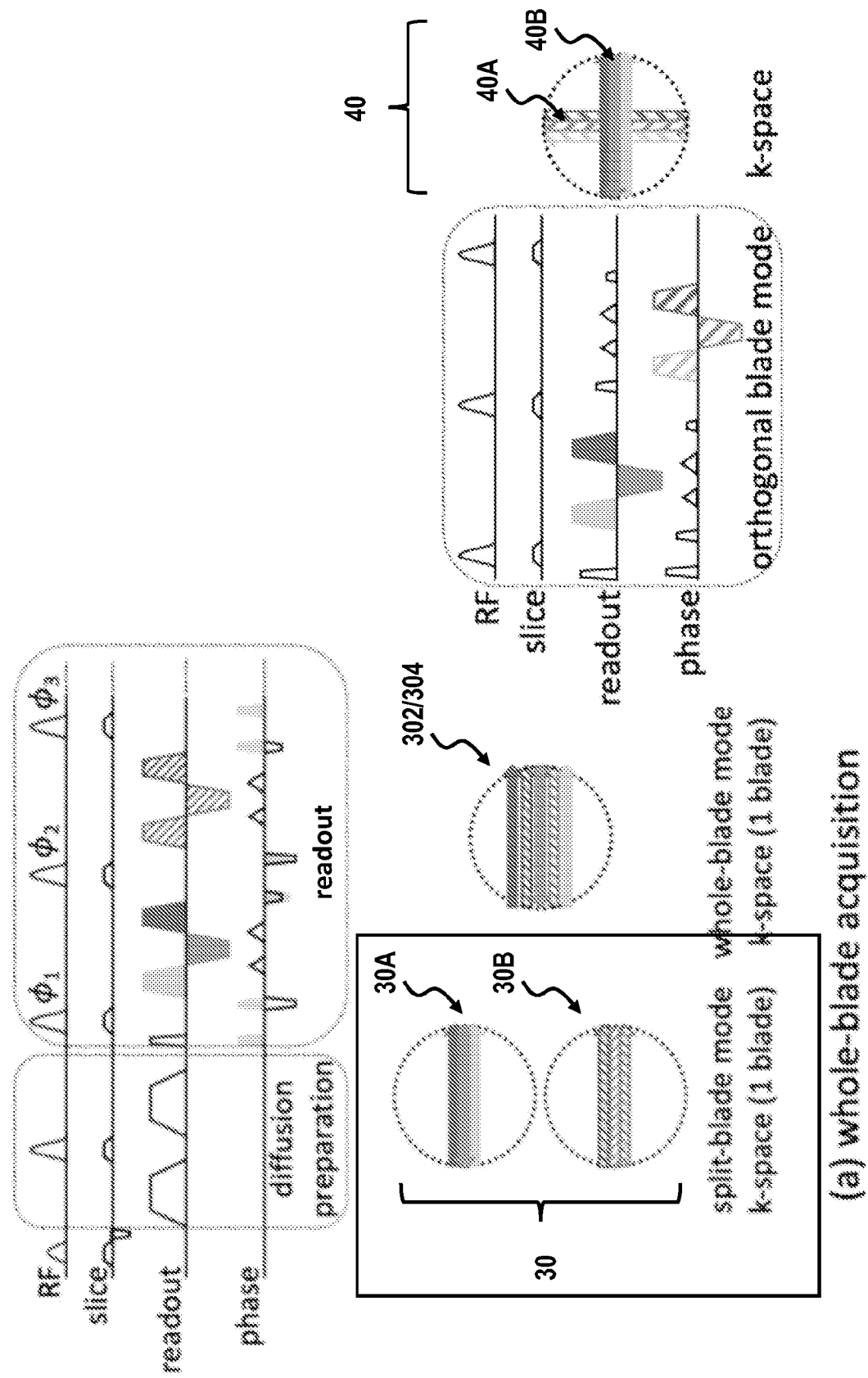
FIG. 4 is a diagram illustrating a split-blade acquisition mode and a whole-blade acquisition mode in k-space of the system of FIG. 1.
Figure 5:
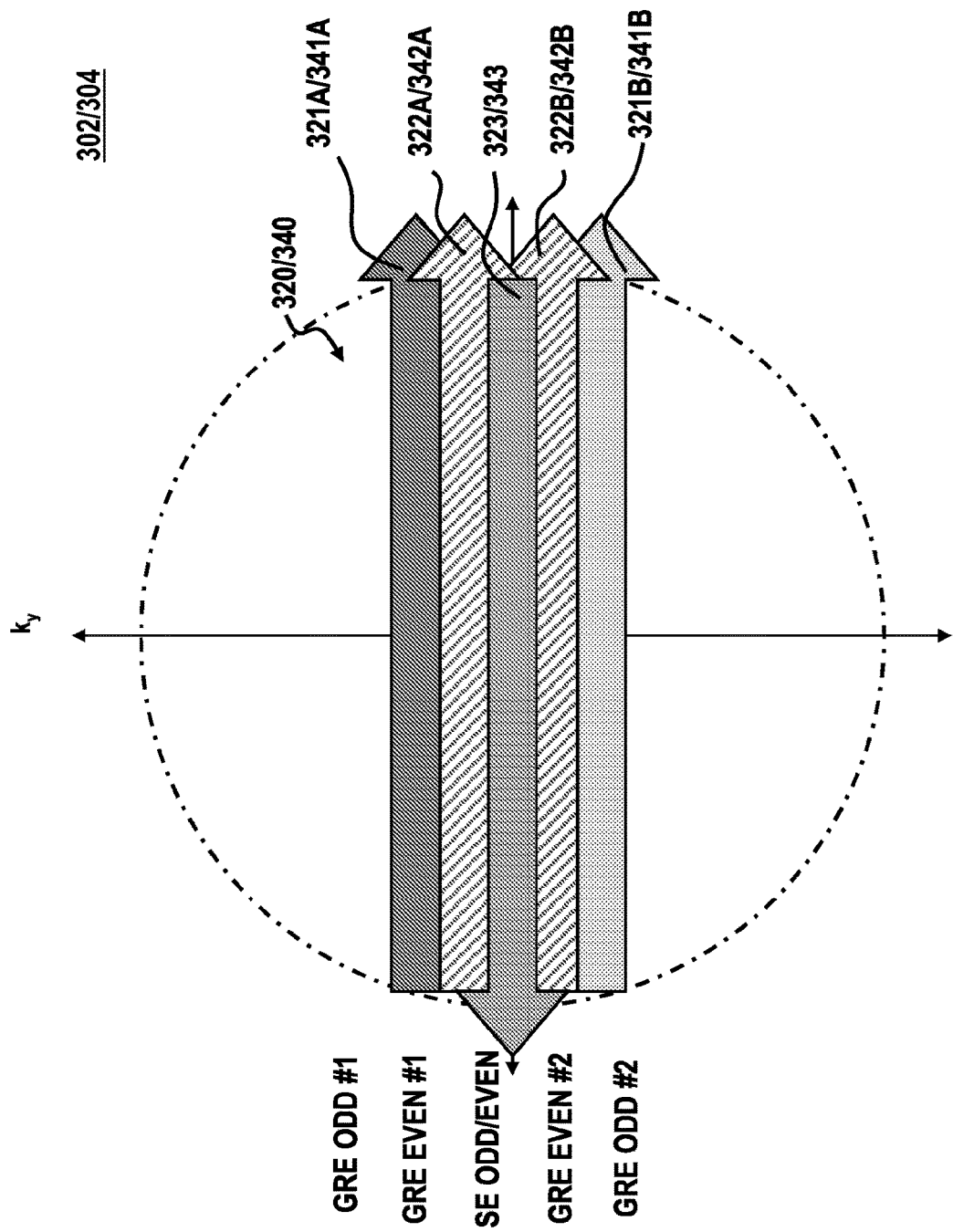
FIG. 5 is a diagram showing a whole k-space blade orientation in k-space using whole-blade acquisition mode of the system of FIG. 1.
Figures 6A, 6B, 6C, 6D:
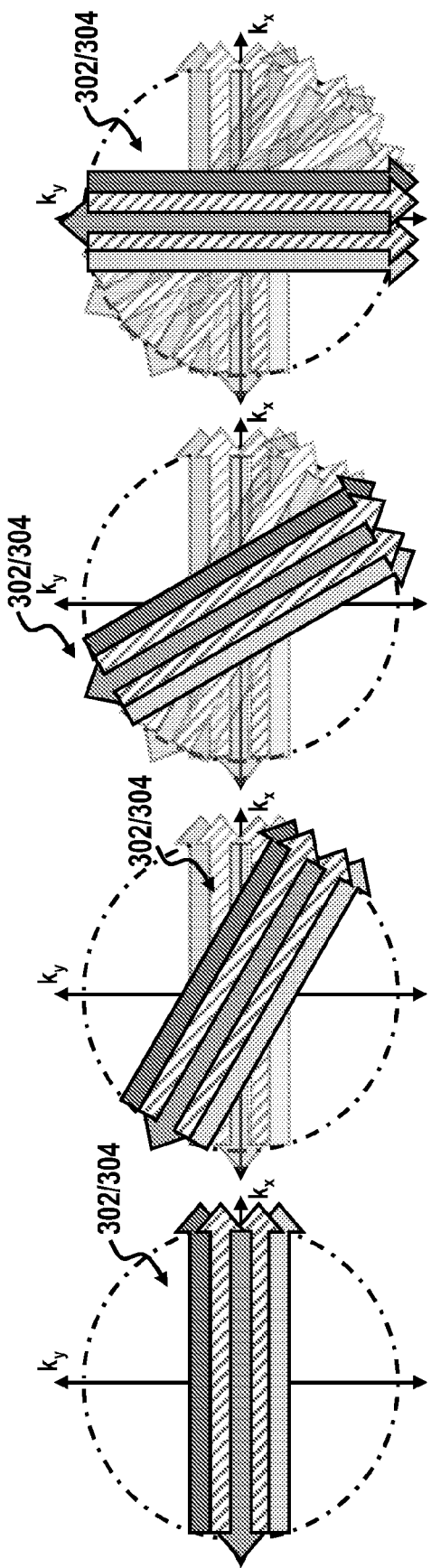
FIGS. 6A-6D are a series of images showing rotation of the whole k-space blade of FIG. 5 in k-space for acquisition of k-space image data.

As shown in FIGS. 3-5, each sampling k-space blade 302 includes several sampling sub-blades 320; and each resultant k-space blade echo 304 includes a plurality of sub-blade echoes 340. Each sampling sub-blade 320 is a type of signal applied and sampled back into k-space as a sub-blade echo 340. In some embodiments of the system 100, each sampling k-space blade 302 includes a plurality of odd sampling sub-blades 321 and a plurality of even sampling sub-blades 322 that sample different phases in k-space. For the system 100, the plurality of odd sampling sub-blades 320 includes at least one odd sampling spin-echo (SE) sub-blade 323A and a plurality of odd sampling gradient-echo (GRE) sub-blades 321A and 321B. Similarly, for the present system 100, the plurality of even sampling sub-blades 320 includes at least one even sampling SE sub-blade 323B and a plurality of even sampling GRE sub-blades 322A and 322B. Each sampling sub-blade 320 corresponds with a respective sub-blade echo 340 that is received in the receiver coils 116 of the MR device 102 and is positioned in k-space where the corresponding sampling sub-blade 320 was taken.

Figure 8:
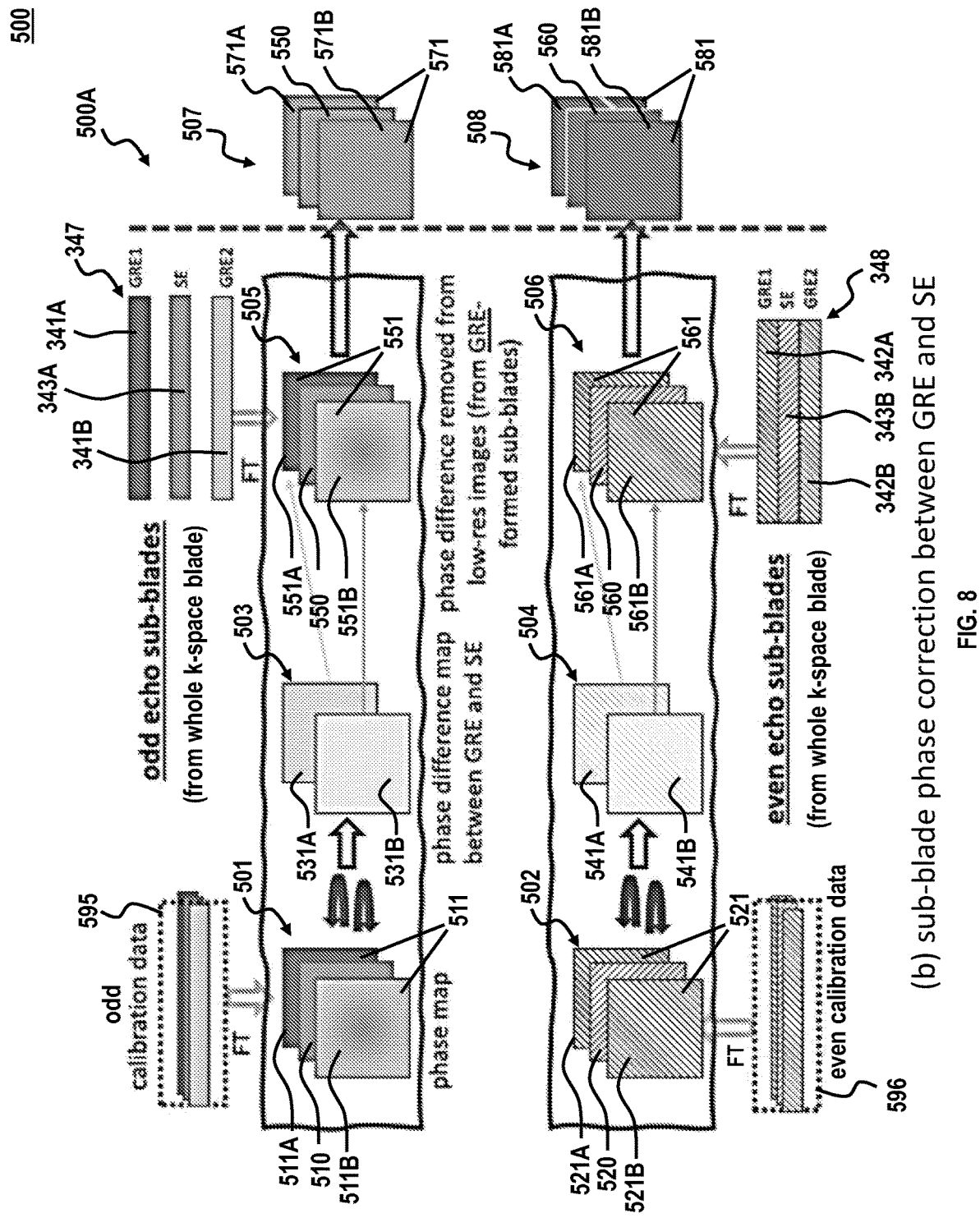
FIG. 8 is a diagram showing a first phase of a whole-blade phase correction pipeline of the system of FIG. 1 that corrects phase differences between gradient-echo and spin-echo sub-blades of the whole k-space blade in image space.

In some embodiments, each k-space blade echo 304 includes a plurality of odd sub-blade echoes 347 (FIG. 8) and a plurality of even sub-blade echoes 348 (FIG. 8). For the present system 100, the plurality of odd sub-blade echoes 347 includes one odd SE sub-blade echo 343A and a plurality of odd GRE sub-blade echoes 341A and 341B. Similarly, for the present system 100, the plurality of even sub-blade echoes 348 includes at least one even SE sub-blade echo 343B and a plurality of even GRE sub-blade echoes 342A and 342B. It should be noted that the number of odd and even GRE sub-blades 321 and 322 and resultant odd and even GRE sub-blade echoes 341 and 342 can vary; for instance, in the schematic diagram of FIG. 5, 2 groups of GRE sub-blades (odd and even) 321 and 322 and 1 SE sub-blade 343 are shown for simplicity (a total of 3 sub-blades). In theory, a total number of sub-blades can be 3, 5, 7, etc. (correspondingly, 2 GRE+1 SE, 4 GRE+1 SE, 6 GRE+1 SE). In practice, 5 sub-blades is most common.

Whole-Blade Acquisition of MR Data

In the embodiment shown in FIGS. 4-6D, the system 100 includes a strategy for whole-blade acquisition of MR data from an object 10 using an MR device 102. In previous works, odd and even sub-blade echoes are placed in separate blades in k-space (split-blade; odd blade 30A and even blade 30B of blade 30 arranged in separate k-spaces at the same blade angle) to avoid interference from phase differences due to quadratic phase modulation, as shown in the example of FIG. 4A. These two blades 30A and 30B are collected at the same blade angle, equivalent to 2 signal averages, resulting in longer scan time. One way to speed up the scan is collecting these blades at orthogonal blade angles as shown (odd blade 40A and even blade 40B of blade 40 arranged at orthogonal blade angles) and an embodiment that incorporates orthogonal blade angles is discussed in greater detail in a later section. However, the implementation may be highly dependent on a specific scanner's hardware platform. To overcome this issue, the system 100 presents a whole-blade acquisition strategy that places all received from each shot in the same blade 302 and corrects for phase differences in reconstruction. As shown in FIGS. 5, with the new k-space arrangement, the odd and even SE sub-blade echoes 343 are placed in the center of k-space. Odd and even GRE sub-blade echoes 341 and 342 are placed in an interleaving fashion in the rest of k-space.

In the embodiment of FIGS. 5 and 8, the odd SE sub-blade echo 343A and the even SE sub-blade echo 343B of the k-space blade echo 304 are collected at the center of k-space. The overlapping locations of the odd SE sub-blade echo 343A and the even SE sub-blade echo 343B in k-space enable the use of the odd and even SE sub-blade echoes 343 to serve as calibration data. A first even GRE sub-blade echo 342A and a second even GRE sub-blade echo 342B are each collected in k-space exterior to the SE sub-blades 343, as illustrated. Further, the first odd GRE sub-blade echo 341A and the second odd GRE sub-blade echo 341B are each collected in k-space exterior to the first even GRE sub-blade echo 342A and the second even GRE sub-blade echo 342B. It should be noted that a larger number of odd and even GRE sub-blade echoes can be taken; for instance, the system 100 can obtain any practical quantity including third, fourth and fifth pairs of odd and even GRE sub-blades and arrange them in k-space exterior to one another in ascending order.

While scans for odd and even sub-blades of the plurality of sampling sub-blades 320 are conducted separately, as shown in FIG. 4, their corresponding k-space frequency-domain information is encoded within the same k-space; thus the system 100 can image more of k-space at a time instead of imaging the same k-space twice.

Whole-blade Phase Correction

Figure 7:
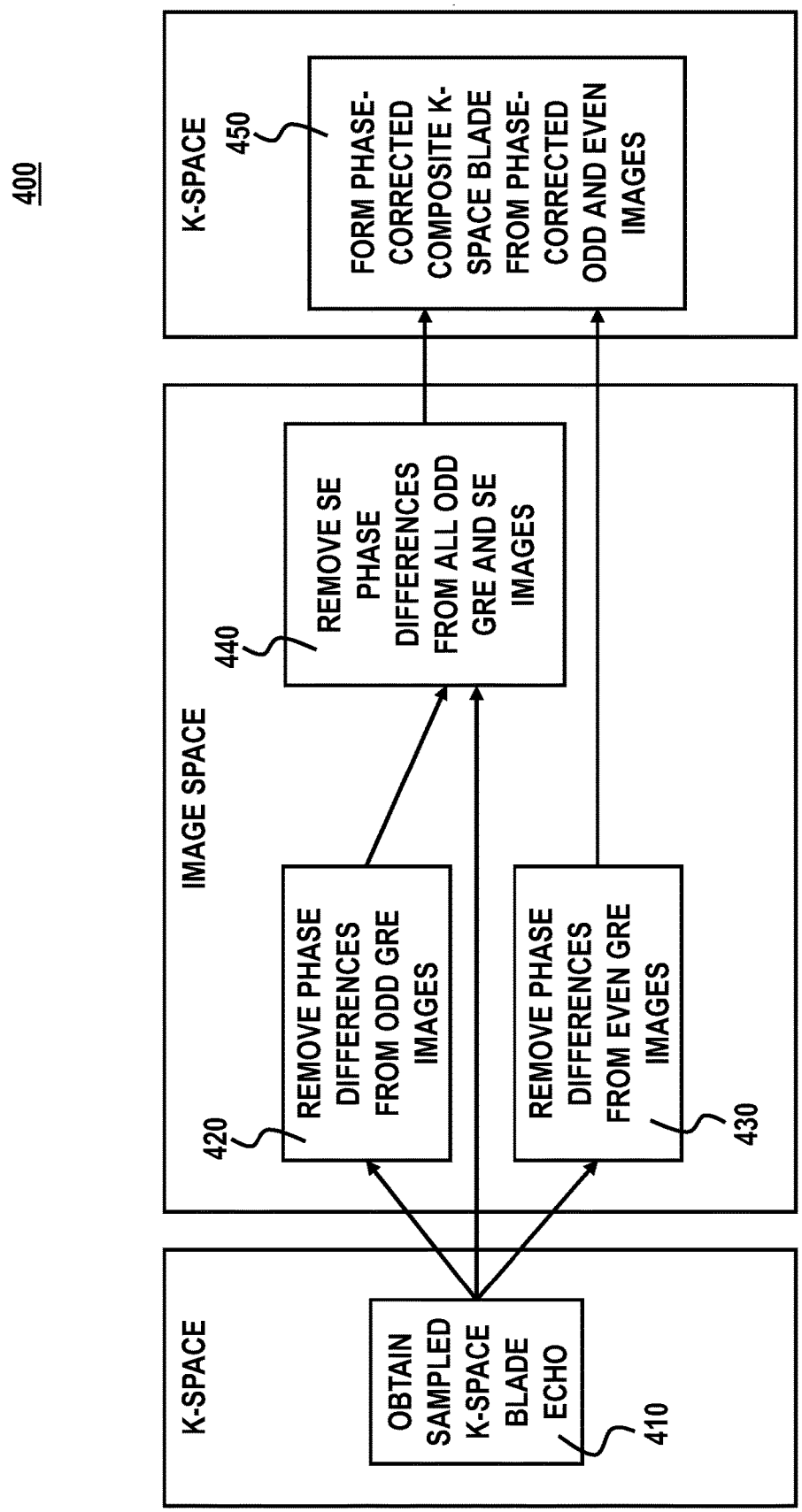
FIG. 7 is a simplified diagram showing an overview of a 2-stage phase correction process of the whole-blade acquisition and phase correction methodology.
Figure 9:
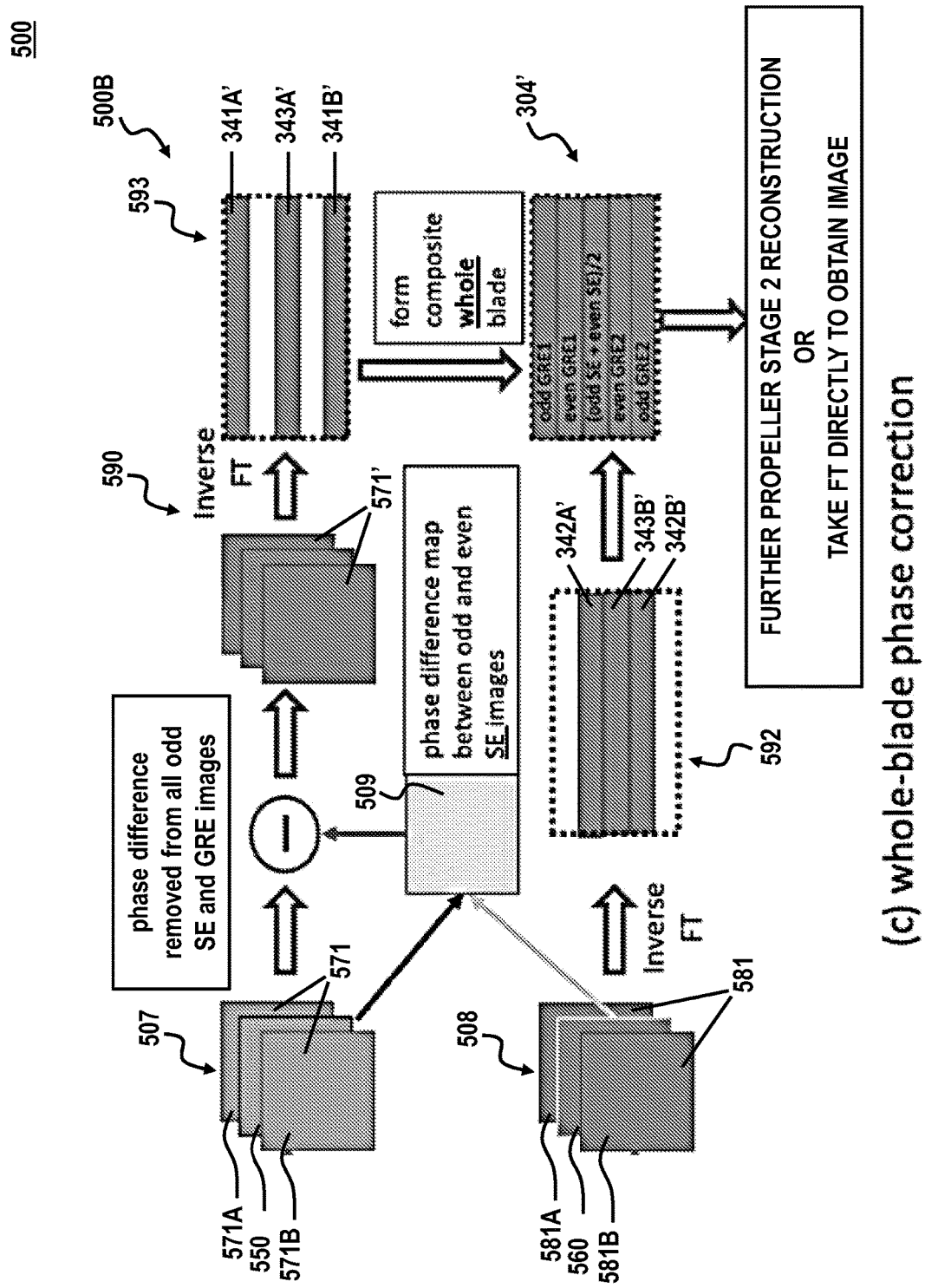
FIG. 9 is a diagram showing a second phase of a whole-blade phase correction pipeline of the system of FIG. 1 that aligns a phase of all odd or even sub-blades with a spin-echo sub-blade of opposing parity in the whole k-space blade in image space.

An image reconstruction pipeline for whole-blade phase correction is shown in FIGS. 7-9. In a first stage 500A of a whole-blade phase correction pipeline 500, phase differences in the plurality of GRE sub-blade echoes 341 and 342 are first corrected separately for odd and even echoes, as also illustrated at blocks 410, 420 and 430 of process 400 in FIG. 7. In a second stage 500B of the whole-blade phase correction pipeline 500, phase differences between odd and even echoes 347 and 348 are then corrected, as also illustrated at blocks 440 and 450 of process 400 in FIG. 7. The final result is a whole phase-corrected composite blade 304' with enforced phase consistency across all echoes. Compared to previously utilized split-blade mode, this whole-blade mode increases the blade width and consequently reduces the scan time by a factor of ~2, without the g-factor penalty associated with parallel imaging.

With previous approaches that do not implement whole-blade acquisition, most phase errors are estimated and removed from each sub-blade echo. Because the sub-blade width is narrow, the estimation is not robust to large phase errors. In addition, as most phase errors are removed in this step, phase correction in a following regular PROPELLER reconstruction pipeline (when combining coil data) has little impact. In contrast, the system 100 includes the two-stage whole-blade phase correction approach illustrated as process 400 in FIG. 7 and pipeline 500A and 500B in FIGS. 8 and 9. In the first phase 500A of the pipeline illustrated in FIG. 8, the system 100 corrects for phase errors due to field variations from the plurality of GRE sub-blade echoes. These field variation-induced phase errors are relatively small and vary slowly in images. Therefore, the estimation accuracy is not affected much despite the narrow sub-blade width. In the second phase 500B illustrated in FIG. 9, phase correction is applied to the whole blade echo when combining data from all coils. In this stage, as a large portion of phase errors due to bulk motion are also estimated and removed, a wider blade width significantly improves robustness.

Pre-processing and Transformation into Image Space

Referring directly to FIG. 8, a first stage 500A of a whole-blade phase correction pipeline 500 is illustrated. The computing system 104 accesses data descriptive of the k-space blade echo 304 including a plurality of sub-blade echoes 340 and individually applies an image-domain transformation to each sub-blade echo 340 of the plurality of sub-blade echoes 340. The image-domain transformations result in a plurality of sub-blade echo images 505 and 506 including a plurality of odd and even GRE echo images 551 and 561 that each correspond to respective odd and even GRE echoes 341 and 342, and at least one pair of odd and even SE echo images 550 and 560 that each correspond to respective odd and even SE echoes 343A and 343B. The computing system 104 also obtains GRE calibration data 595 and 596 in addition to the k-space blade echo 304 including information about a phase of each sub-blade echo 340 for correcting phase errors in GRE echo images. They are acquired in addition to the regular image data. For the calibration data, GREs have the same k-space as SE, all in the center of k-space. The calibration data 595 and 596 can be transformed into image space to generate a plurality of phase maps 501 and 502. Each phase map 501 and 502 of the plurality of phase maps 501 and 502 corresponds to a sub-blade echo 340 of the plurality of sub-blade echoes 340. In some embodiments, the transformation into image space for both generation of the plurality of phase maps 501 and 502 and generation of the plurality of sub-blade echo images 505 and 506 involves a Fourier transform operation.

Odd and Even Phase Map Generation

In one embodiment, the system 100 transforms odd calibration data 595 into image space to generate a plurality of odd sub-blade phase maps 501, the plurality of odd sub-blade phase maps 501 including at least a first odd GRE phase map 511A corresponding with a phase of the first odd GRE sub-blade echo 341A, and an odd spin-echo phase map 510 corresponding with a phase of the odd SE sub-blade echo 343A based on the odd calibration data 595 and the plurality of odd sub-blade echoes 347. The plurality of odd sub-blade phase maps 501 can further include a second odd GRE phase map 511B corresponding with a phase of the second odd GRE sub-blade echo 341B, as shown, and in some embodiments can further include any practical quantity including third, fourth or fifth odd GRE phase maps (not shown) corresponding with respective phases of third, fourth or fifth odd GRE sub-blade echoes (not shown).

Similarly, the system 100 transforms even calibration data 596 into image space to generate a plurality of even sub-blade phase maps 502, the plurality of even sub-blade phase maps 502 including at least a first even GRE phase map 521A corresponding with a phase of the first even GRE sub-blade echo 342A and an even spin-echo phase map 520 corresponding with a phase of the even SE sub-blade echo 343B based on the even calibration data 596 and the plurality of even sub-blade echoes 348. The plurality of even sub-blade phase maps 502 can further include a second even GRE phase map 521B corresponding with a phase of the second even GRE sub-blade echo 342B, as shown, and in some embodiments can further include any practical quantity including third, fourth or fifth even GRE phase maps (not shown) corresponding with respective phases of third, fourth or fifth even GRE sub-blade echoes (not shown).

Odd and Even Sub-blade Image Generation

In one embodiment, the system 100 transforms the odd echoes 347 of the sampled k-space blade echo 304 into image space to generate a plurality of odd sub-blade echo images 505, the plurality of odd sub-blade echo images 505 including at least a first odd GRE echo image 551A corresponding with the first odd GRE sub-blade echo 341A, and an odd spin-echo image 550 corresponding with the odd SE sub-blade echo 343A based on the plurality of odd sub-blade echoes 347 in k-space. The plurality of odd sub-blade echo images 505 can further include a second odd GRE echo image 551B corresponding with the second odd GRE sub-blade echo 341B, as shown, and in some embodiments can further include third, fourth or fifth odd GRE echo images (not shown) respectively corresponding with third, fourth or fifth odd GRE sub-blade echoes (not shown).

Similarly, the system 100 transforms the even echoes 348 of the sampled k-space blade echo 304 into image space to generate a plurality of even sub-blade echo images 506, the plurality of even sub-blade echo images 506 including at least a first even GRE echo image 561A corresponding with the first even GRE sub-blade echo 342A, and an even spin-echo image 560 corresponding with the even SE sub-blade echo 343B based on the plurality of even sub-blade echoes 348 in k-space. The plurality of even sub-blade echo images 506 can further include a second even GRE echo image 561 corresponding with the second even GRE sub-blade echo 342, as shown, and in some embodiments can further include third, fourth or fifth even GRE echo images (not shown) respectively corresponding with third, fourth or fifth even GRE sub-blade echoes (not shown).

It should be noted that at this step, each sub-blade echo 340 is transformed to image space independently, not altogether to form one image. For example, the first and second even GRE sub-blade echoes 342A and 342B and the even SE sub-blade echo 343B of FIG. 8 are transformed to generate 3 individual "images" 561A, 561B and 560, and 1st stage phase correction is subsequently performed on the 2 GRE sub-blade echo "images" 561A and 561B to align with the associated SE image of the same parity, in the present example, even SE sub-blade echo image 560.

Odd and Even Phase Difference Map Generation

Following phase map generation for the plurality of sub-blade echoes 340, the system 100 computes a plurality of GRE phase difference maps 503 and 504 corresponding to a respective phase difference between each GRE sub-blade echo 341 and 342 of the plurality of GRE sub-blade echoes 341 and 342 and the corresponding SE sub-blade echo 343 of the same parity. In particular, as odd and even sub-blade echoes 347 and 348 are processed separately, the system 100 generates a plurality of odd GRE phase difference maps 503 between each odd GRE phase map 511 of the plurality of odd GRE phase maps 511 and the corresponding odd SE phase map 510. Similarly, the system 100 generates a plurality of even GRE phase difference maps 504 between each even GRE phase map 521 of the plurality of even GRE phase maps 521 and the corresponding even SE phase map 520.

In particular, the plurality of odd GRE phase difference maps 503 includes at least a first odd GRE phase difference map 531A corresponding with a difference between the first odd GRE phase map 511A and the odd SE phase map 510. In some embodiments, such as the embodiment shown in FIG. 8, the plurality of odd GRE phase difference maps 503 can further include a second odd GRE phase difference map 531B corresponding with a difference between the second odd GRE phase map 511B and the odd SE phase map 510, as shown, and in some embodiments can further include third, fourth or fifth odd GRE phase difference maps (not shown) corresponding with respective differences between the third, fourth or fifth odd GRE sub-blade echoes (not shown) and the odd SE phase map 510.

Similarly, the plurality of even GRE phase difference maps 504 includes at least a first even GRE phase difference map 541A corresponding with a difference between the first even GRE phase map 521A and the even SE phase map 520. In some embodiments, such as the embodiment shown in FIG. 8, the plurality of even GRE phase difference maps 504 can further include a second even GRE phase difference map 541B corresponding with a difference between the second even GRE phase map 521B and the even SE phase map 520, as shown, and in some embodiments can further include third, fourth or fifth even GRE phase difference maps (not shown) corresponding with respective differences between the third, fourth or fifth even GRE sub-blade echoes (not shown) and the even SE phase map 520.

Image Domain GRE Sub-blade Phase Difference Removal

As further illustrated in FIG. 8, the system 100 then removes the phase difference between each GRE sub-blade echo image 551 and 561 of the plurality of GRE sub-blade echo images 551 and 561 and their corresponding SE sub-blade echo images 550 and 560 to generate a plurality of GRE-adjusted sub-blade echo images 507 and 508. In particular, for each odd GRE sub-blade echo image 551 of the plurality of odd GRE sub-blade images 551, the system 100 removes the corresponding odd GRE phase difference map 503 from the odd GRE sub-blade echo image 551 resulting in a plurality of phase-corrected odd GRE sub-blade echo images 571. Following the phase difference removal step, each phase-corrected odd GRE sub-blade echo image 571 should be of the same phase as the corresponding odd SE sub-blade echo image 571. In particular, the odd GRE phase difference map 531A is removed from the first odd GRE sub-blade echo image 551A to form a first phase-corrected odd GRE sub-blade echo image 571A. Similarly, the second odd GRE phase difference map 531B is removed from the second odd GRE sub-blade echo image 551B to form a second phase-corrected odd GRE sub-blade echo image 571B.

Similarly, for each even GRE sub-blade echo image 561 of the plurality of even GRE sub-blade images 561, the system 100 removes the corresponding even GRE phase difference map 504 from the even GRE sub-blade echo image 561 resulting in a plurality of phase-corrected even GRE sub-blade echo images 581. Following the phase difference removal step, each phase-corrected even GRE sub-blade echo image 581 should be of the same phase as the corresponding even SE sub-blade echo image 560. In particular, the even GRE phase difference map 541A is removed from the first even GRE sub-blade echo image 561A to form a first phase-corrected even GRE sub-blade echo image 581A. Similarly, the even GRE phase difference map 541B is removed from the second even GRE sub-blade echo image 561B to form a second phase-corrected even GRE sub-blade echo image 581B. The odd and even SE sub-blade echo images 550 and 560 remain intact during the first stage 500A of the whole-blade phase correction pipeline 500.

SE Phase Correction

Referring to FIG. 9, in the second stage 500B of the whole-blade phase correction pipeline 500, each odd or even GRE-adjusted sub-blade echo images 507 and 508 of the plurality of plurality of GRE-adjusted sub-blade echo images 507 and 508 are aligned with one another. In particular, a phase of each GRE-adjusted sub-blade echo image 507 and 508 of the plurality of GRE-adjusted sub-blade echo images 507 and 508 are aligned with a phase of the odd SE sub-blade image 550 or with a phase of the even SE sub-blade image 560. The system 100 computes an SE phase difference map 509 between the odd SE sub-blade image 550 and the even sub-blade image 560. The system 100 then removes the SE phase difference map 509 from each odd GRE-adjusted sub-blade echo image 507 of the plurality of odd GRE-adjusted sub-blade images 507, or from each even GRE-adjusted sub-blade image 508 of the plurality of even GRE-adjusted sub-blade images 508 depending on a selected parity alignment. FIG. 9 illustrates one particular embodiment where a phase of each odd GRE-adjusted sub-blade image 507 of the plurality of odd GRE-adjusted sub-blade images 507 is aligned with the even SE sub-blade echo 560 in image space by removing the SE phase difference map 509 from each odd GRE-adjusted sub-blade image 507 of the plurality of odd GRE-adjusted sub-blade images 507. In other embodiments, a phase of each even GRE-adjusted sub-blade image 508 of the plurality of even GRE-adjusted sub-blade images 508 is aligned with the odd SE sub-blade echo 550 in image space by removing the SE phase difference map 509 from each even GRE-adjusted sub-blade image 508 of the plurality even GRE-adjusted sub-blade images 508.

In the embodiment shown in FIG. 9, the alignment step discussed above results in a plurality of corrected sub-blade images 590 and 508 including a plurality of corrected odd sub-blade images 571' and a plurality of corrected even sub-blade images 581A and 581B.

Formation of a Corrected Whole Composite Blade

Following the alignment step discussed above, the plurality of corrected sub-blade images 590 and 508 are each converted into k-space by application of an inverse Fourier transform-based operation. In particular, this operation yields a plurality of corrected odd sub-blade echoes 593 and a plurality of corrected even sub-blade echoes 592 in k-space. The system 100 combines the plurality of corrected odd sub-blade echoes 593 and the plurality of corrected even sub-blade echoes 592 in k-space to form the phase-corrected whole composite blade echo 304'.

Following generation of a phase-corrected whole composite blade echo 304', further image reconstruction techniques can be applied. In some embodiments, such as when implemented in an ss-GRASE pipeline, the phase-corrected whole composite blade echo 304' can be subjected to an additional image-space conversion step to obtain an image. In other embodiments, such as when implemented within a TURBOPROP pipeline, the phase-corrected whole composite blade 304' can be subjected to further PROPELLER stage 2 reconstruction techniques common to a standard PROPELLER pipeline.

Whole Blade Mode+SENSE or GRAPPA

Figure 11:
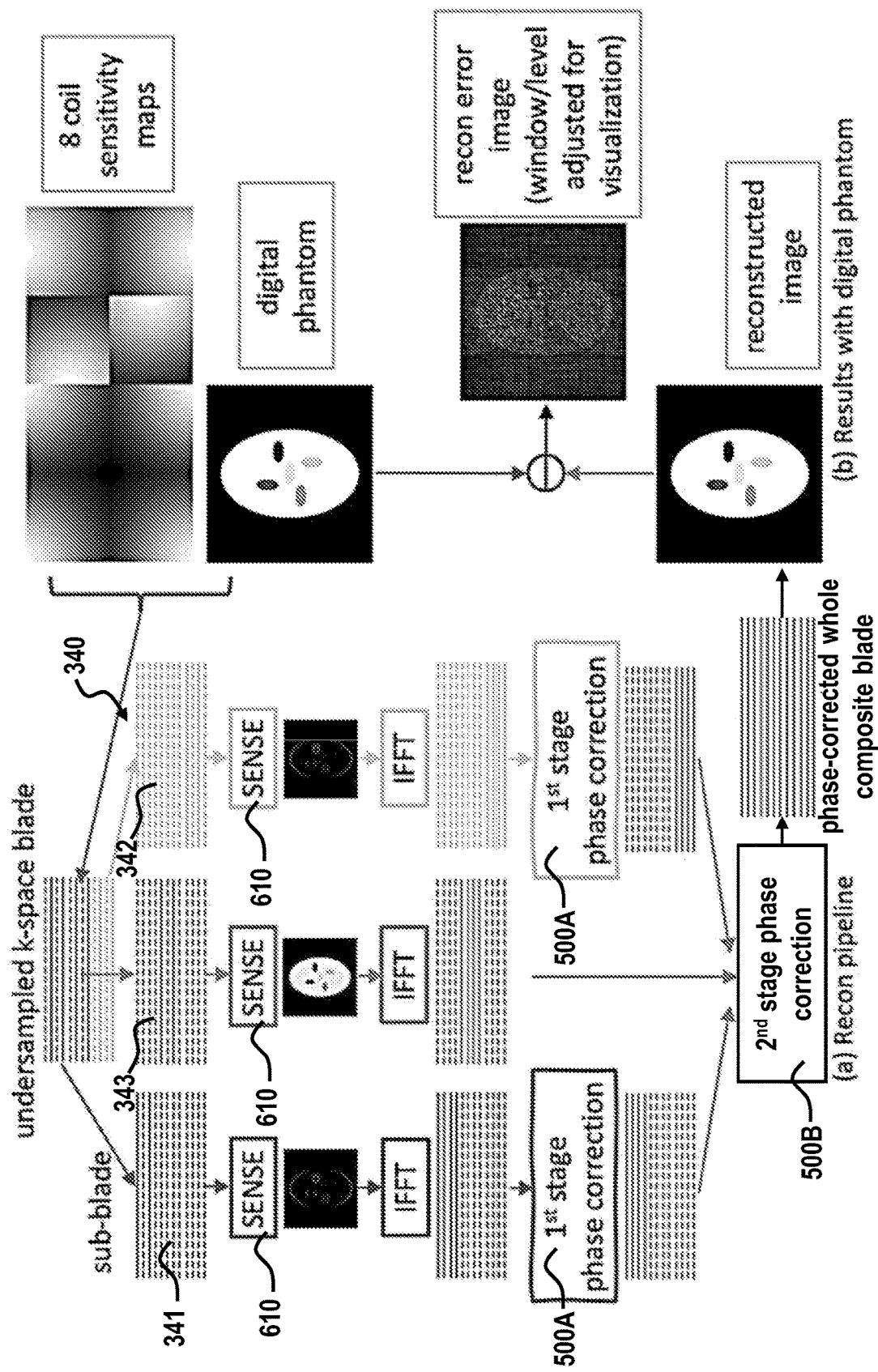
FIG. 11 is a diagram showing the whole-blade phase correction pipeline of the system of FIG. 1 incorporating a SENSE parallel imaging method on individual sub-blades of the whole k-space blade.

In some embodiments, additional image cleanup techniques can be applied within the whole blade phase correction pipeline 500 as shown in FIG. 11. In particular, in the embodiment of FIG. 11, each sub-blade echo 340 is individually passed through a regular SENSE reconstruction pipeline 610. The resulting un-warped low-pass filtered image (from SE sub-blade echoes 343) and high-pass filtered images (from GRE sub-blade echoes 341 and 342) undergo the first stage 500A of the whole-blade phase correction pipeline 500. Subsequently, the sub-blades are combined into a wider composite blade in the second stage 500B of the whole-blade phase correction pipeline 500. In some embodiments, regular PROPELLER reconstruction can also be performed on the whole blade. Preliminary results using simulated digital phantom data indicate that the full image is successfully recovered, demonstrating its feasibility.

Figure 12:
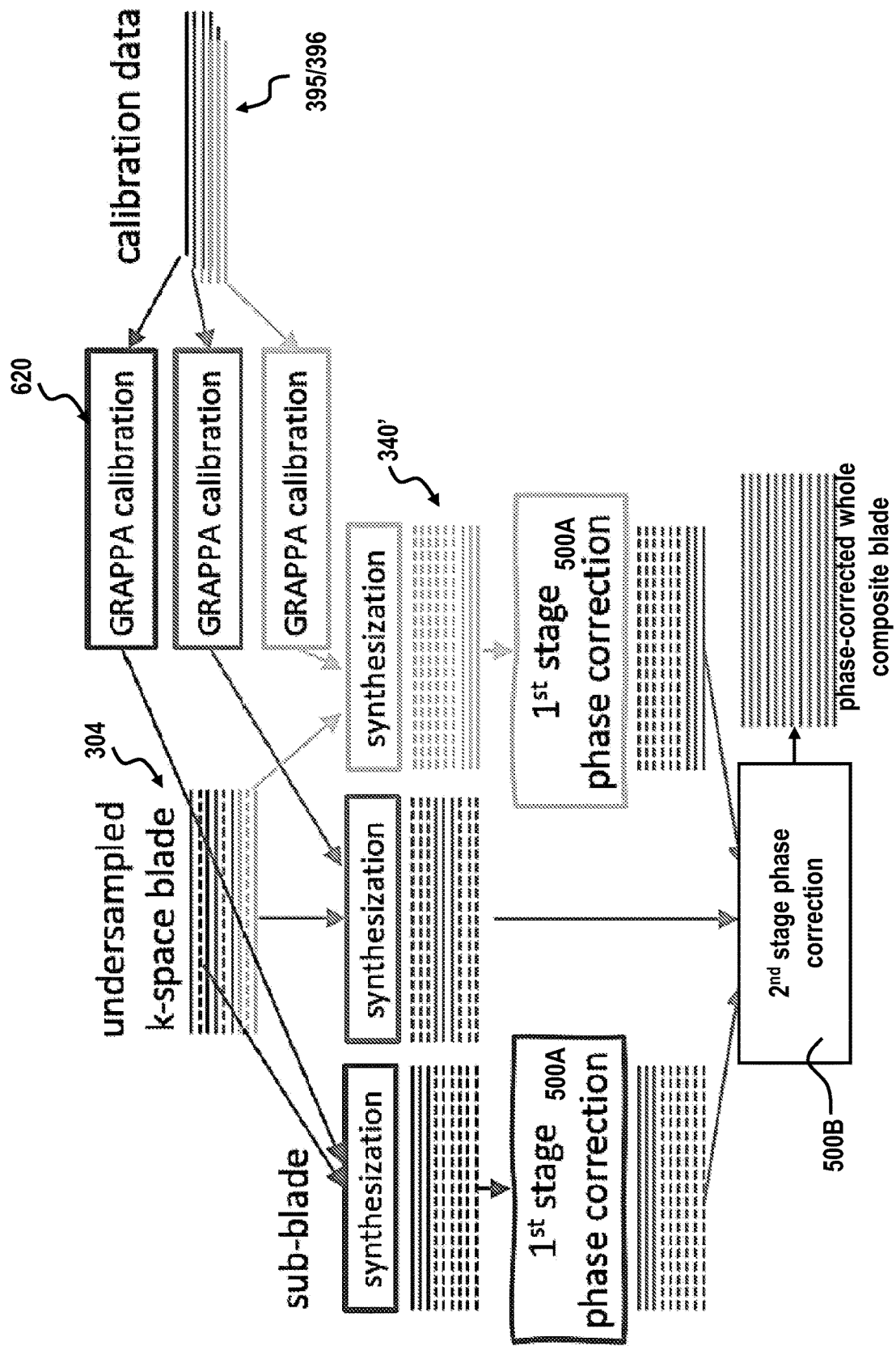
FIG. 12 is a diagram showing the whole-blade phase correction pipeline of the system of FIG. 1 incorporating a GRAPPA parallel imaging method on individual sub-blades of the whole k-space blade.

In the embodiment of FIG. 12, integration of a GRAPPA reconstruction technique into the whole blade phase correction pipeline 400 is illustrated. The system 100 can apply a GRAPPA calibration operation 620 to calibration data 595 and 596 for each sub-blade echo 340 of the plurality of sub-blade echoes 340. Further, the system 100 can apply a GRAPPA synthesization technique 630 separately to each sub-blade echo 340 of the plurality of sub-blade echoes 340, as illustrated. Resultant GRAPPA-processed sub-blade echoes 340' can be subjected to the whole-mode phase correction methodology 500.

Blade Sharing

Figure 13:
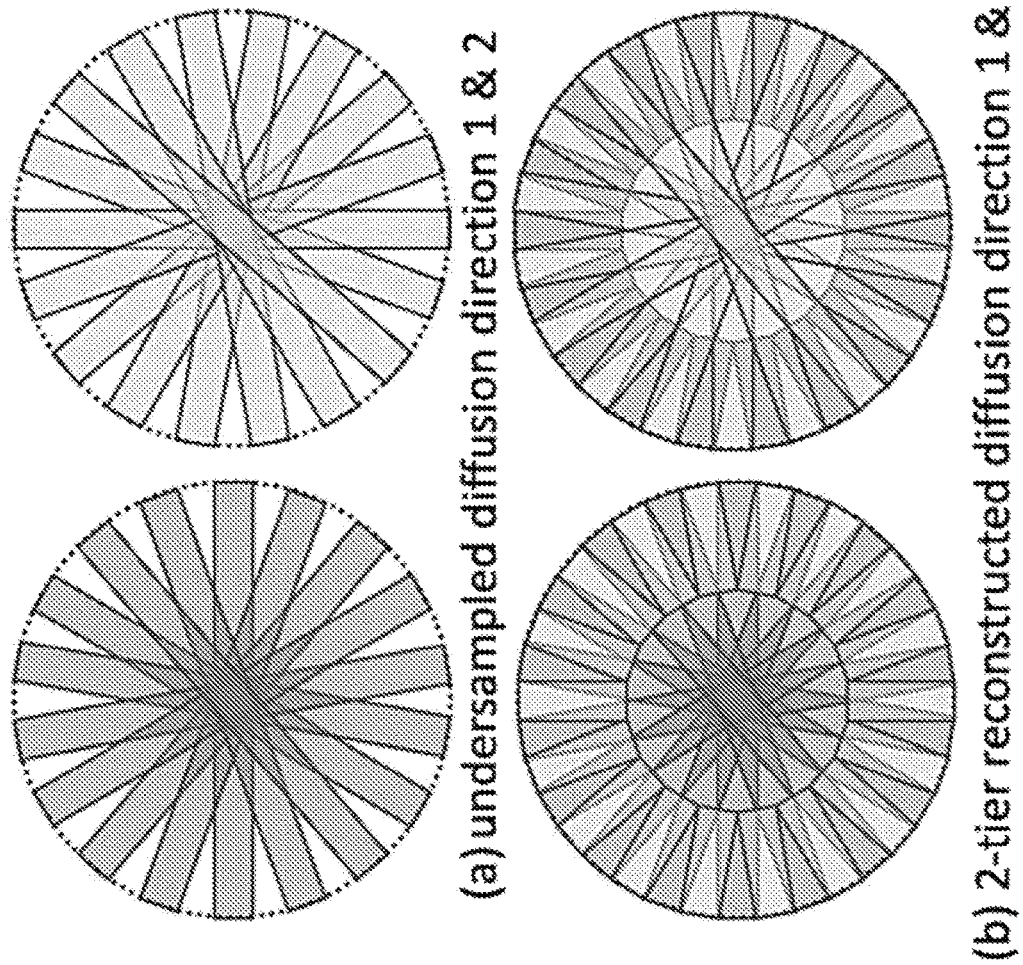
FIG. 13 is a diagram showing a blade-sharing technique for post-processing of acquired blades using the system of FIG. 1.

Referring to FIG. 13, some embodiments of the system 100 can perform additional reconstruction steps including a blade sharing technique. In DTI scans, typically 32 or more diffusion directions are desired for accurate quantitative measurement. With 32 or more directions, data of close diffusion directions have similar signal weighting. To utilize this similarity, the system 100 can incorporate blade-sharing technique which keeps blade-wise undersampled data of target direction in the center of k-space, while adding data from nearby direction in the outer k-space to satisfy the Nyquist criterion. This allows for an acceleration factor that equals the number of tiers. For a 32-direction DTI scheme, an example range of angle between optimized pairs of diffusion directions is 13°-16° for a 2-tier sharing scheme. Therefore, by combining the 2-tier sharing scheme and the whole-blade mode, which is 2 times wider than that from split-blade mode and therefore allows for a 2× acceleration, an acceleration factor of 4 can be achieved compared to previous split-blade technologies. In some embodiments, a blade sharing technique can be described as follows: the system collects first blade data from a first k-space blade in k-space, and second blade data from the second k-space blade in k-space. K-space defines an inner center section and an outer concentric section; the system 100 combines the second blade data from the outer concentric section of the second k-space blade with the first blade data of the first k-space blade as shown in FIG. 13 in order to fill in missing edge data.

Figure 16A:
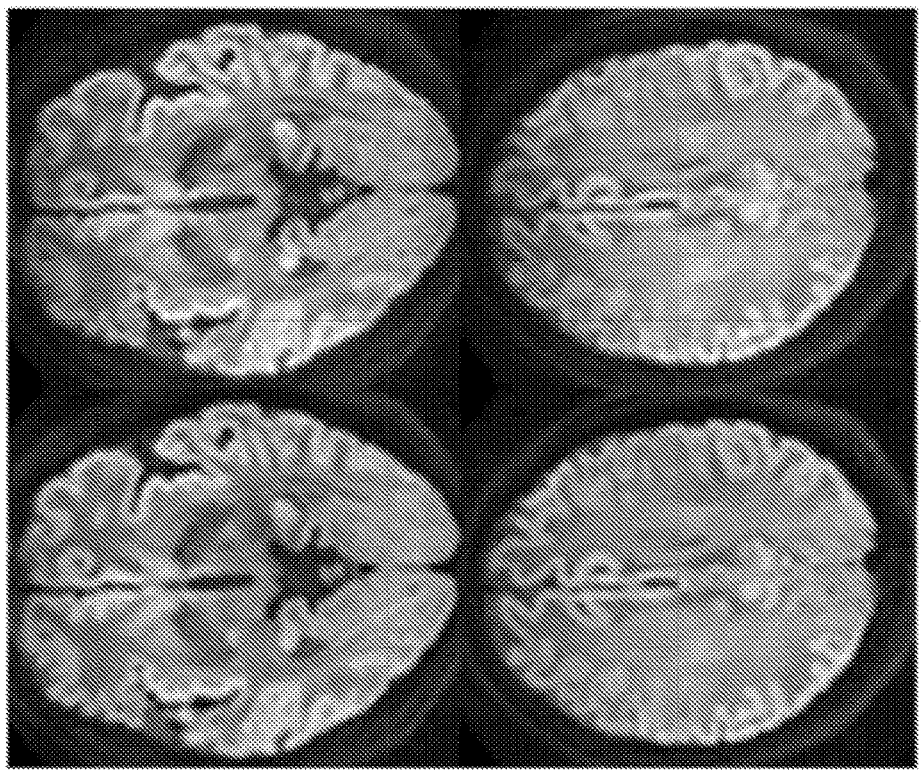
FIGS. 16A-16C are a series of MR images taken using the blade sharing technique of FIG. 13 compared against conventional MR methods.

The sequence was implemented on a Philips 3T Ingenia scanner. Volunteer data were scanned with whole-blade mode and blade sharing using the following parameters: FOV=230×230 mm2, resolution=2.25×2.25 mm2, slice thickness=2 mm, gap=0 mm, 60 slices, ETL=12, GRASE factor=5, one b=0 and 32 directions with b=1000 s/mm2, scan time=~7:20. Data were also acquired without blade sharing to examine its performance. In this experiment, data with whole-blade and blade sharing were acquired with 2× oversampling to match the scan time of data without blade sharing for a fair comparison. Reference data were acquired with an ssEPI-based clinical protocol, with scan time about 6:40. A resolution of 2×2 mm2 was used in ssEPI considering T2*-decay-induced blurring in the phase encoding direction. FIG. 16A confirms the image quality of data acquired with blade sharing. Compared to the trace images without blade sharing, the quality of images with blade sharing are comparable, demonstrating its feasibility. The data with blade sharing in this comparison were acquired with 2× oversampling (to match scan time) and therefore can be acquired twice faster than data without sharing.

Figure 16B:
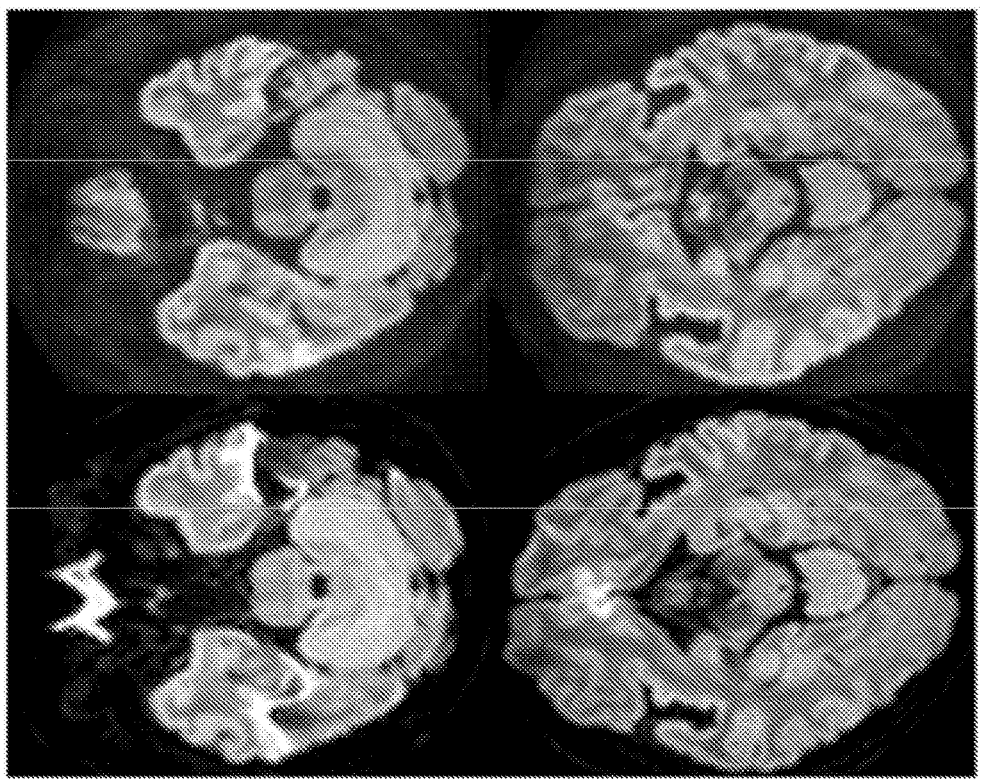

The minimization of distortion artifacts with turboPROP is illustrated and compared with ssEPI in FIG. 16B. As expected, the distortion artifacts observed in images from ssEPI are not present in turboPROP.

Figure 16C:
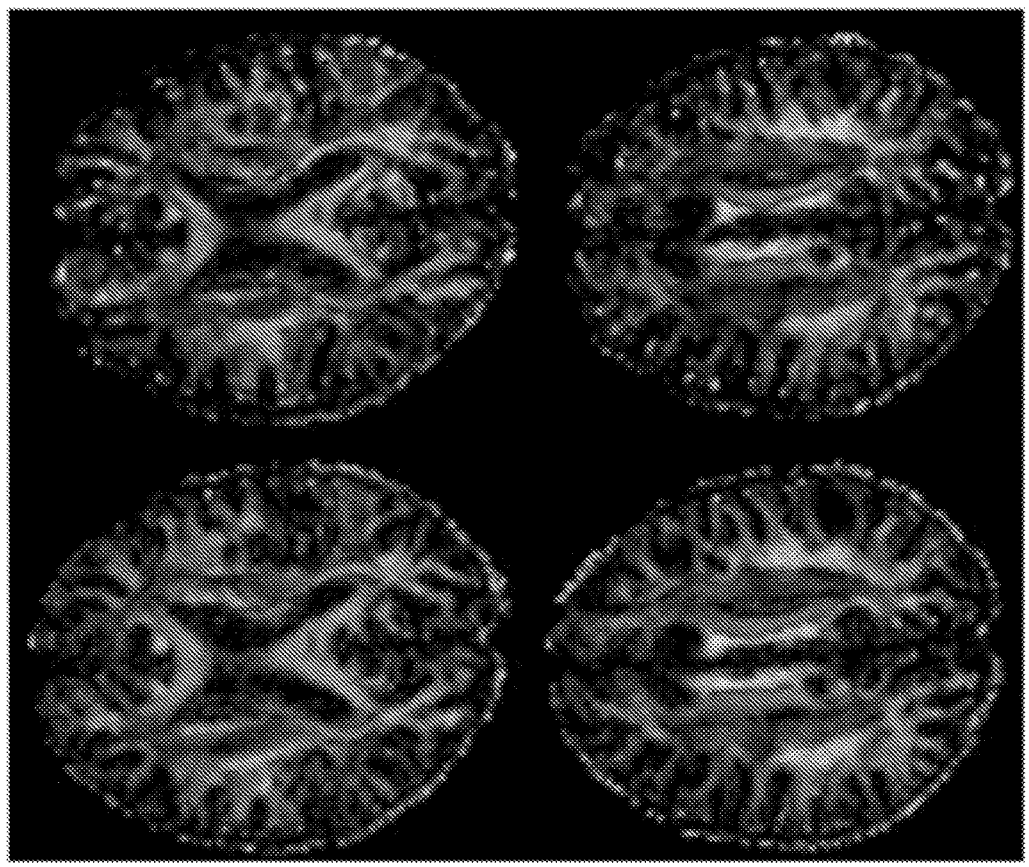

FIG. 16C demonstrates the quality of quantitative measurement between ssEPI and turboPROP. The fractional anisotropic map calculated from turboPROP data is in general comparable to that from ssEPI, indicating good accuracy.

Orthogonal Acquisition+First Stage Correction

Figure 10:
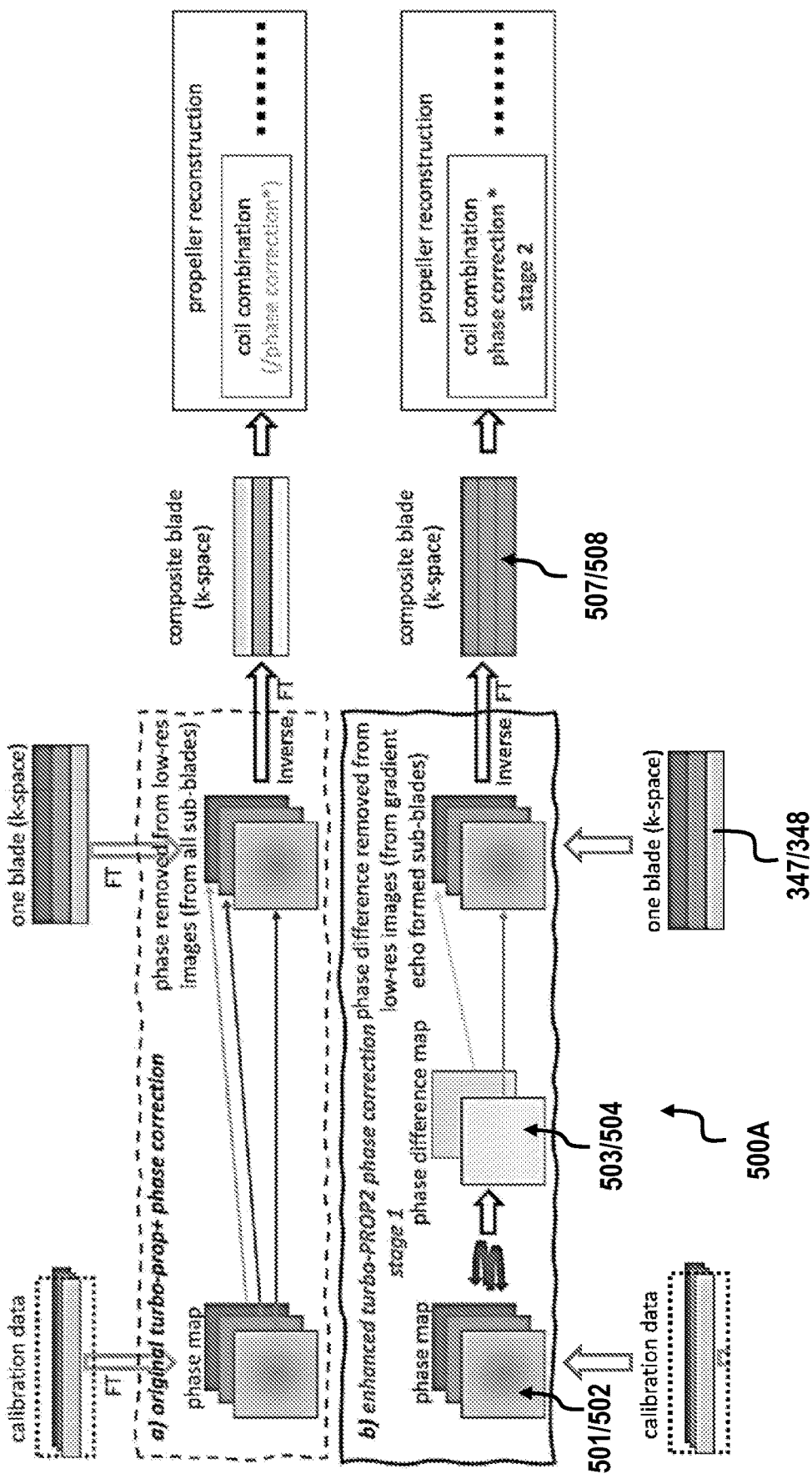
FIG. 10 is a diagram showing orthogonal blade phase correction as applied using the first phase of the whole-blade phase correction pipeline of FIG. 8.

Referring to FIGS. 4, 8 and 10, in some embodiments, an alternative sampling and phase-correction methodology can be used with the first stage 400A of the whole-blade phase correction pipeline 400. An orthogonal sampling strategy 40 illustrated with the k-space configuration shown in FIG. 4 can traverse k-space twice as quickly as split-blade parallel sampling. In some embodiments, an orthogonal sampling strategy can be implemented in place of the whole-mode acquisition strategy detailed above. Following acquisition of a k-space blade by orthogonal sampling, the k-space blade can be phase-corrected by application of the first stage 500A (FIG. 8) of the whole-blade phase correction pipeline 500 in which odd and even sub-blade echoes 347 and 348 are corrected separately with respect to their corresponding odd or even SE sub-blade echoes 343A and 343B. Resultant GRE-corrected odd and even sub-blade echoes 507 and 507B (shown in k-space form) can then be subjected further to PROPELLER reconstruction techniques. FIG. 10 in particular shows a comparison between split-blade mode (parallel such as blade 30 of FIG. 4 or orthogonal such as blade 40 of FIG. 4) and a previous turboprop+phase correction methodology. As shown, phase difference maps 503 and 504 are generated based on phase maps 501 and 502 as discussed above and the phase difference is removed from the corresponding GRE-corrected odd and even sub-blade echoes 507 and 507B (shown in k-space form).

Cartesian Sampling for Rectangular FOV

Figure 14:
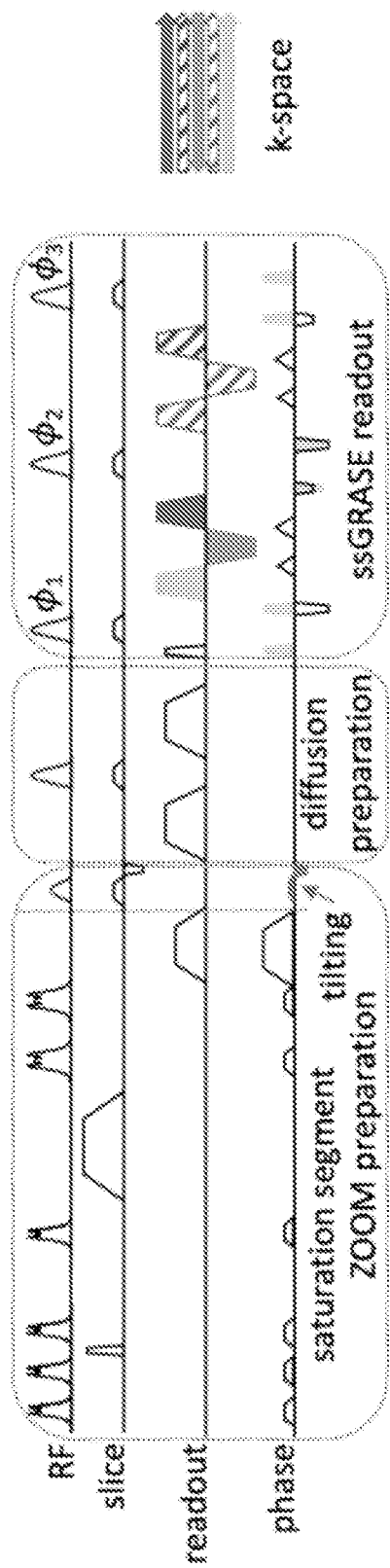
FIG. 14 is a diagram showing a Cartesian sampling strategy that utilizes the whole-blade mode of the system of FIG. 1.

As turboPROP typically acquires a square FOV that covers the full anatomy within the slice, it is suboptimal for spinal imaging. To develop a technique suitable for spinal imaging, this disclosure includes a technique for Cartesian sampling for a rectangular field-of-view (FOV). First, a single-shot GRASE sequence is implemented with Cartesian k-space sampling. This can be regarded as a special "single-blade" turboPROP, but enables a rectangular FOV that is optimal for spinal imaging. Second, a reduced FOV method such as ZOOM can be included to limit the phase FOV, which allows for high resolution in the phase encoding direction. Third, whole-mode acquisition as discussed herein is included within the pipeline to further boost resolution in a phase encoding direction by approximately a factor of 2 (compared to split-mode acquisition), without the need of parallel imaging and therefore without the g-factor penalty. Unlike the split-blade mode used in turboPROP, the whole-mode acquisition collects all odd and even echoes in the same k-space. Since odd and even echoes have different phases due to quadratic phase modulation, additional correction is required (FIGS. 7-9) In FIG. 8, phase differences in gradient echoes are first corrected separately for odd and even echoes. In FIG. 9, phase differences between odd and even echoes are then corrected using information derived from the odd and even SEs that are collected at the center of k-space. All these steps result in final k-space with phase differences corrected for across all echoes. FIG. 14 is a graphical representation showing readouts for whole-mode with Cartesian k-space sampling.

The sequence was implemented on a Philips 3T Ingenia scanner. Volunteers were scanned in axial and sagittal planes of cervical spine, and sagittal plane of thoracic and lumbar spine. Sagittal imaging parameters include: thickness=3 mm, resolution=~2×1 mm2, one b=0 and three b=700 s/mm2 (800 for lumbar spine to better suppress CSF), echo train length=12, GRASE factor=5, 10 signal averages for b=700, FOV is trimmed to the specific segment. Axial C-spine is scanned with FOV=80×66 mm2, resolution=~1.1×1.1 mm2, thickness=5 mm. Scan times vary from 2:30-3:00. For reference, standard ssEPI and recently released product msEPI, all with ZOOM, were also collected with similar scan times and imaging parameters.

Figure 17A:
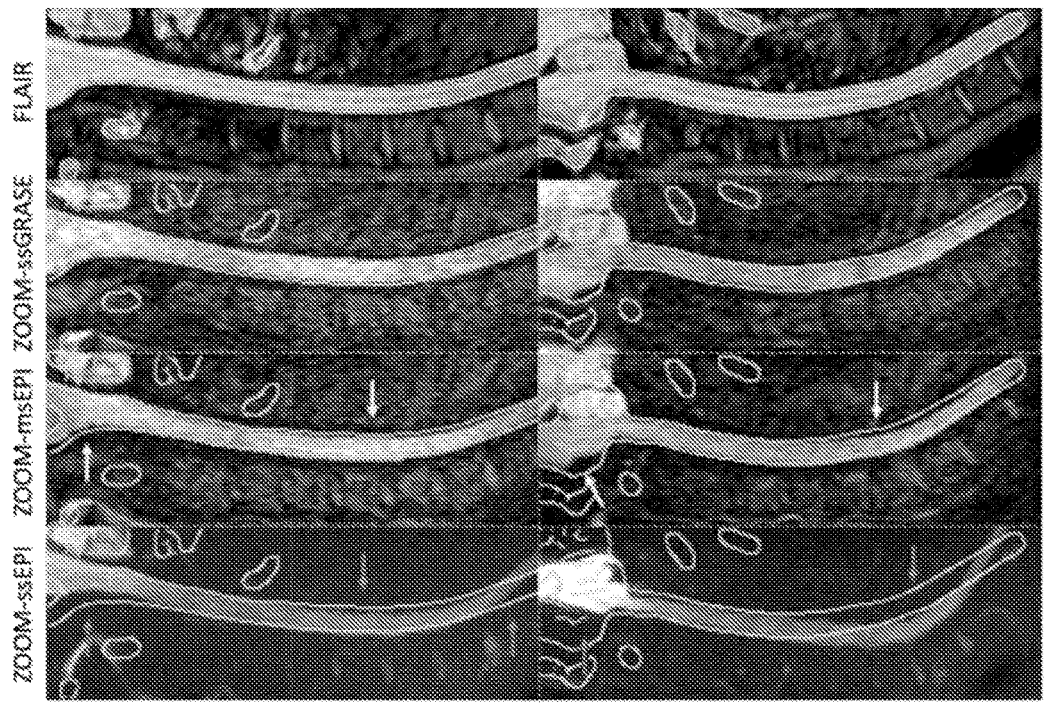
FIGS. 17A-17C are a series of MR images taken using the Cartesian sampling strategy of FIG. 14 compared against conventional MR methods.
Figure 17B:
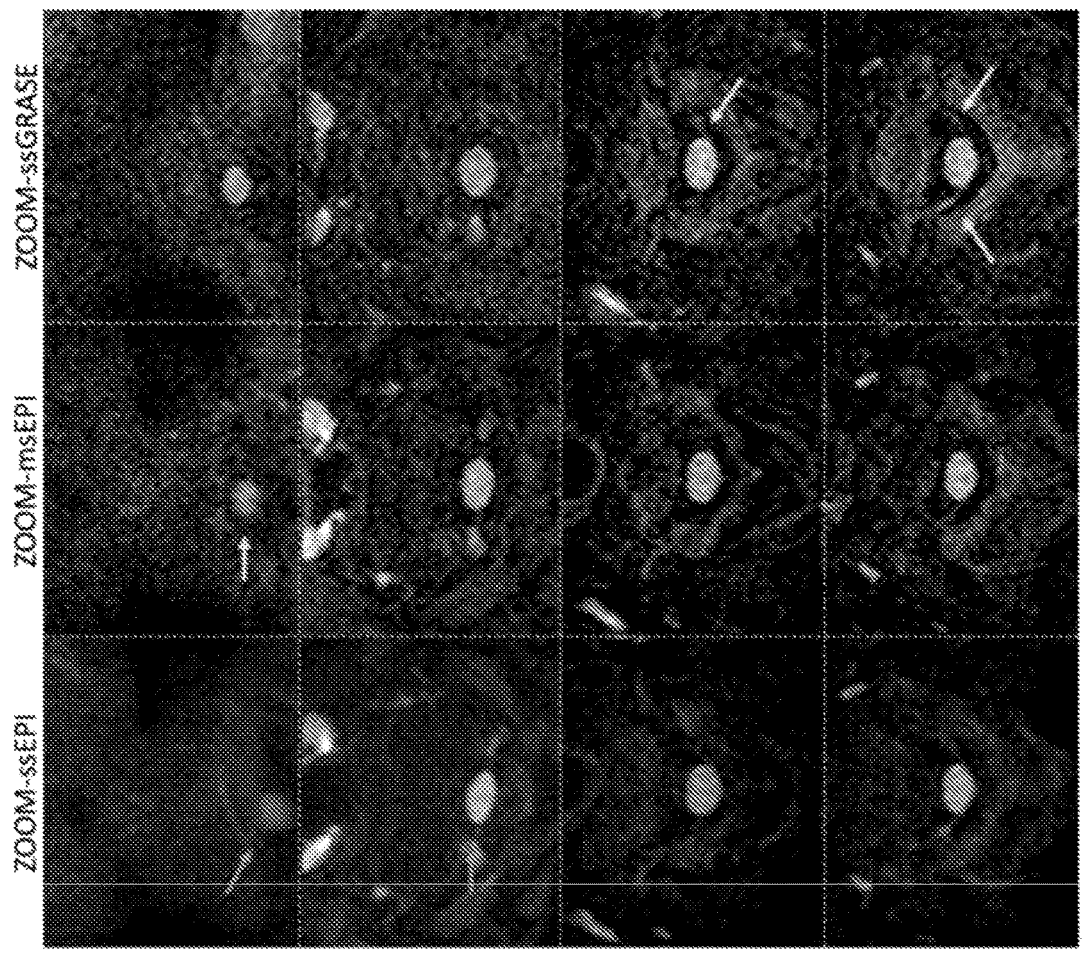

FIG. 17A demonstrates the elimination of distortion artifacts with ssGRASE in sagittal C-spine. As indicated by the contour extracted from FLAIR images, the strong distortion artifacts in ZOOM-ssEPI render it not clinically preferred. These artifacts are dramatically reduced with ZOOM-msEPI; however, residual artifacts are still visible in the volunteer data acquired with optimized shimming on a well calibrated research scanner. It is expected that such artifacts are more prominent in the clinical settings. With the proposed ZOOM-ssGRASE technique, these artifacts are eliminated. Axial C-spine images are presented in FIG. 17B. Distortion artifacts in ssEPI in areas with strong field variation (superior and inferior slices) are reduced in msEPI, and eliminated in ssGRASE. Although the distortion artifacts in ssEPI and msEPI may not be visually disturbing in the middle slices of the axial plane, ssGRASE may provide better delineation of the nerve roots.

Figure 17C:
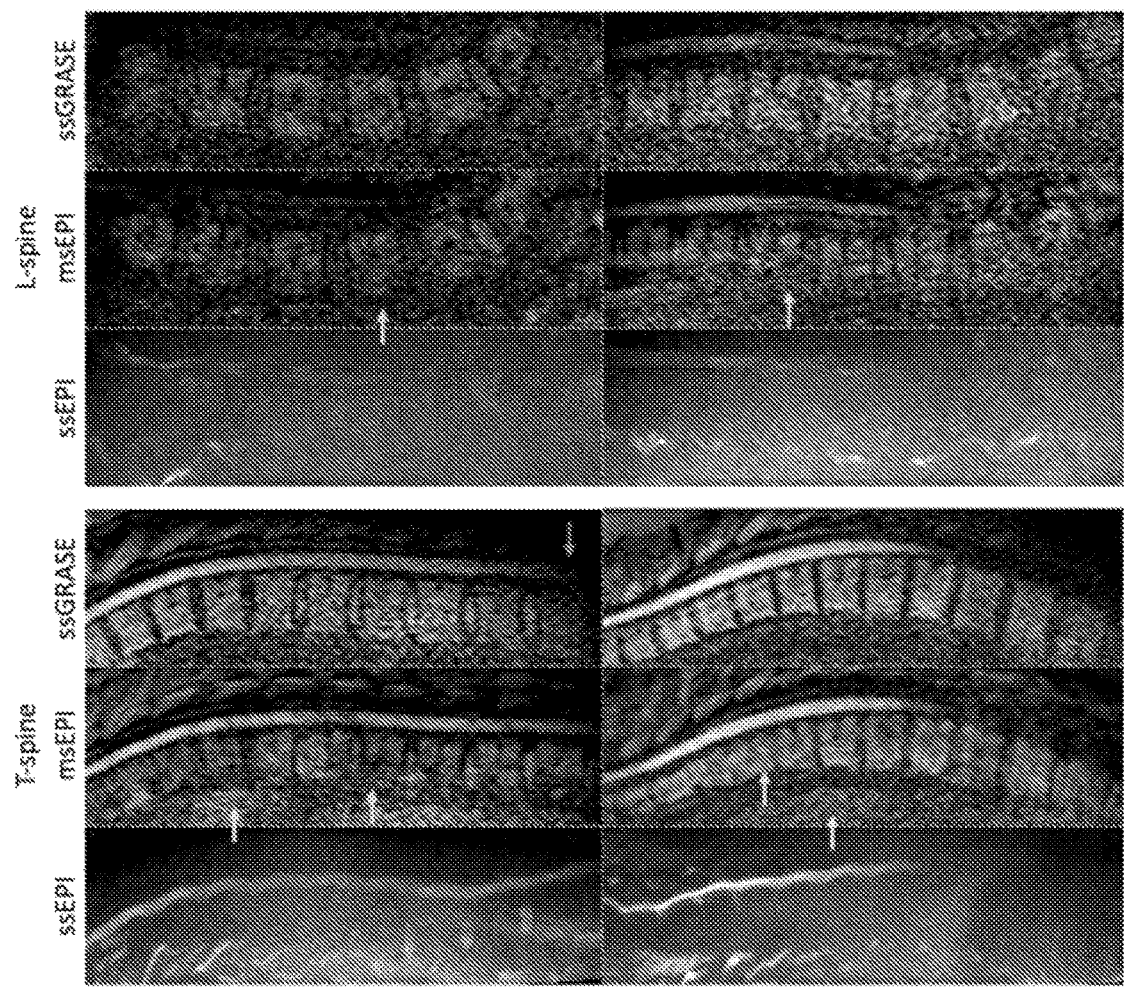

FIG. 17C shows examples of T- and L-spine. Similar to findings from C-spine images, the strong distortion artifacts in ssEPI are significantly reduced in msEPI with some residues, while eliminated in ssGRASE. The SNR of ssGRASE is comparable to that of msEPI. ssGRASE also provides better suppression of background artifacts and better delineation of the vertebral bodies, which is potentially more interesting for L-spine, where the vertebral bodies are the primary focus in many neurological applications (such as the claw sign for diagnosis of degeneration).

Whole-Blade Acquisition and Phase Correction Testing and Results

The whole-blade acquisition sequence was implemented on a Philips 3T Ingenia scanner with a 15-channel phased-array coil. The whole-blade turboPROP technique was compared to recently improved split-blade turboPROP, conventional ssEPI, and two recently released product sequences (msEPI (IRIS) and SPLICE-PROPELLER). Data were collected with the following protocol: FOV=230×230 mm2, resolution=1.25×1.25 mm2, slice thickness=4 mm, gap=1 mm, 24 slices, ETL=12, GRASE factor=5, b=1000 s/mm2 at 3 directions. Scan times for ssEPI, msEPI, whole-blade turboPROP, and SPLICE PROPELLER are 0:50, 2:48, 2:47, 2:30, respectively. In the experiment comparing whole- and split-blade acquisition, both were scanned in ~5:00. A volunteer with a metallic surgical patch near the temporal lobe was scanned to evaluate distortion artifacts in the vicinity of metal. In one scan, the volunteer was instructed to perform reproducible head motions in order to evaluate motion correction capabilities.

Figure 15A:
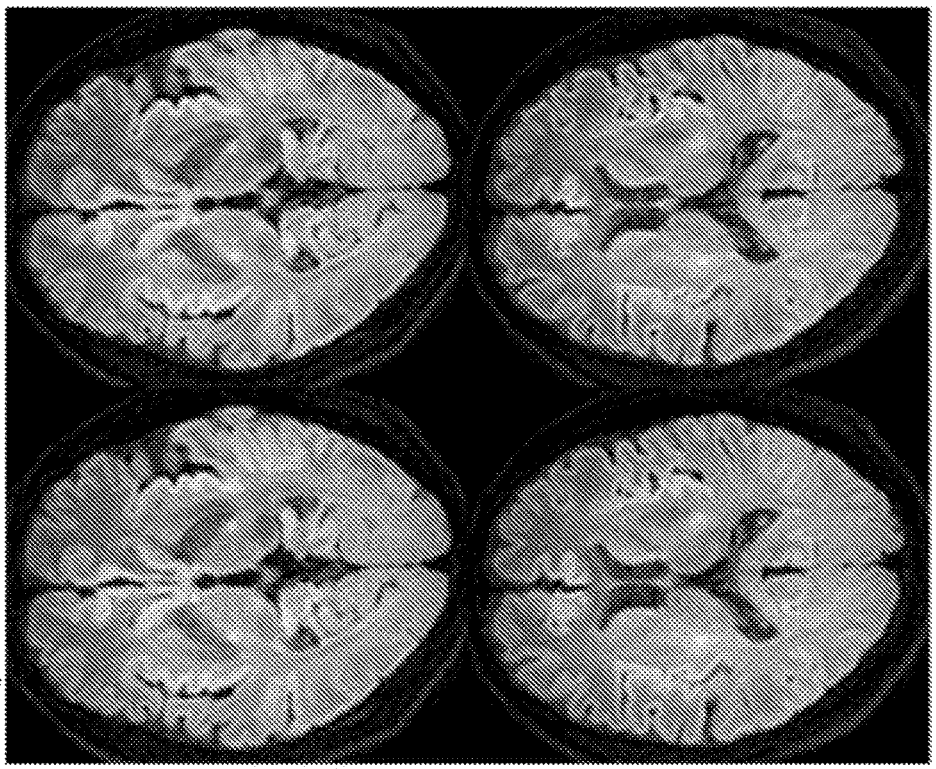
FIGS. 15A-15D are a series of MR images taken using whole-blade mode of the system of FIG. 1 compared against conventional MR methods.

The disclosed whole-blade technique is compared with previous split-blade mode in FIG. 15A. The image quality is comparable, proving the feasibility of the whole-blade mode that can be 2 times faster without parallel imaging.

Figures 15B, 15C:
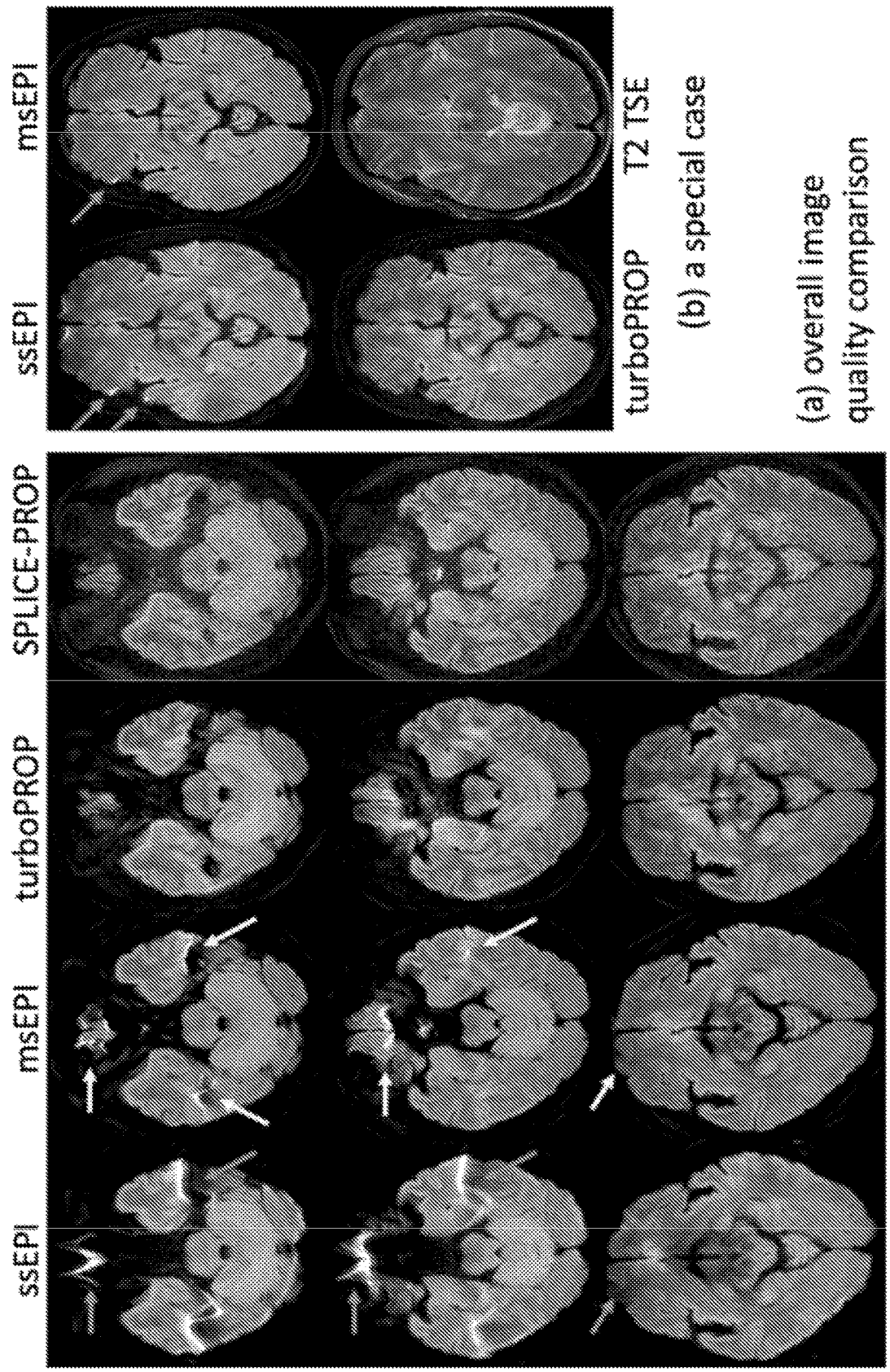

FIG. 15B demonstrates the overall image quality of whole-blade turboPROP compared with ssEPI, msEPI (IRIS), SPLICE-PROPELLER. The strong distortion artifacts in ssEPI are reduced in msEPI but residuals are still present. The distortion artifacts are minimized in turbo-PROP and SPLICE-PROPELLER. The SNR of turboPROP is better than SPLICE-PROPELLER and close to msEPI. FIG. 15C shows the case with a metallic surgical patch. The patch causes signal pileup in ssEPI, which is reduced but still observable in msEPI. These artifacts are not seen in turboPROP.

FIG. 15B compares overall image quality of 4 techniques and FIG. 15C shows a special case in the presence of metal. In FIG. 15B, ssEPI shows strong signal pileup, which is reduced but still present in msEPI. Signal pileup is minimized in turboPROP (with slight signal drop off) and SPLICE-PROPELLER. SNR of turboPROP is much better than SPLICE-PROPELLER, while slightly lower than but still close to msEPI. FIG. 15C shows images from a volunteer with a surgical patch that causes signal pile up in ssEPI and msEPI, which is not visible in turboPROP. T2 TSE is acquired as reference.

Figure 15D:
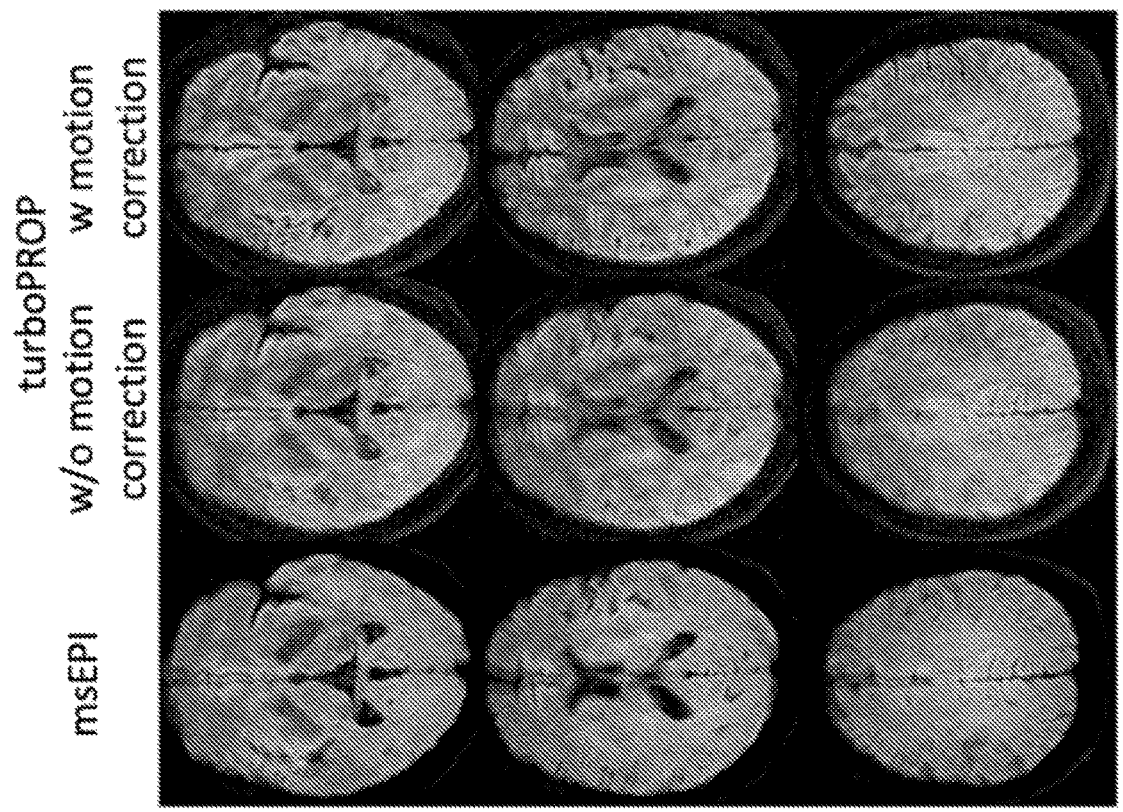

The motion correction capability of turboPROP is illustrated in FIG. 15D. msEPI (IRIS) is able to only remove subtle phase errors, such as due to physiological motion. Whole-blade turboprop with its wider blades allows robust rigid-body motion correction to be applied, with motion corrected results showing significantly reduced artifact in the presence of head motion.

Computer-implemented System

Figure 18:
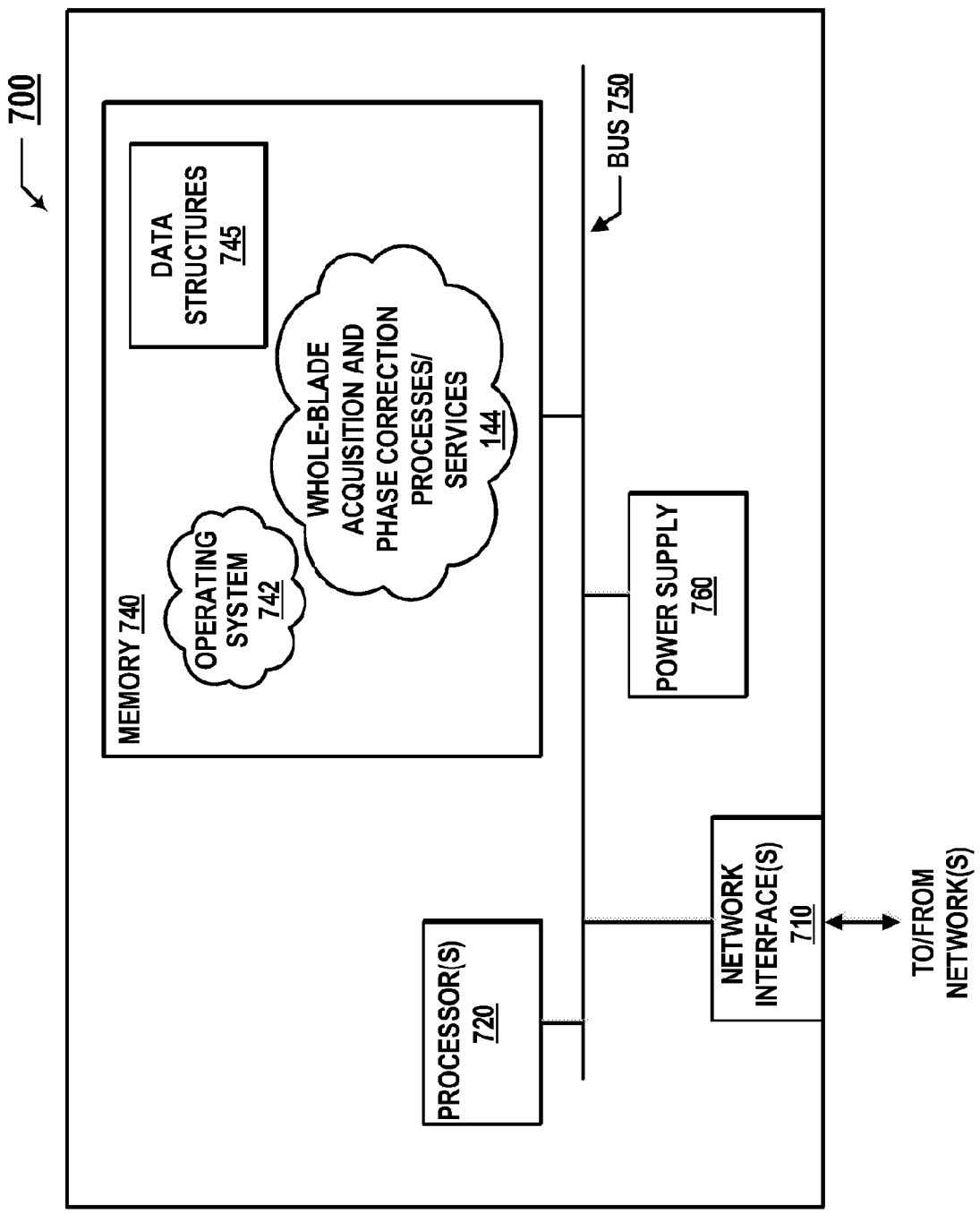
FIG. 18 is a simplified diagram showing an exemplary computing system for implementation of the system of FIG. 1.

FIG. 18 is a schematic block diagram of an example device 700 that may be used with one or more embodiments described herein, e.g., as a component of system 100 and/or as computing device 104 shown in FIG. 1.

Device 700 comprises one or more network interfaces 710 (e.g., wired, wireless, PLC, etc.), at least one processor 720, and a memory 740 interconnected by a system bus 750, as well as a power supply 760 (e.g., battery, plug-in, etc.).

Network interface(s) 710 include the mechanical, electrical, and signaling circuitry for communicating data over the communication links coupled to a communication network. Network interfaces 710 are configured to transmit and/or receive data using a variety of different communication protocols. As illustrated, the box representing network interfaces 710 is shown for simplicity, and it is appreciated that such interfaces may represent different types of network connections such as wireless and wired (physical) connections. Network interfaces 710 are shown separately from power supply 760, however it is appreciated that the interfaces that support PLC protocols may communicate through power supply 760 and/or may be an integral component coupled to power supply 760.

Memory 740 includes a plurality of storage locations that are addressable by processor 720 and network interfaces 710 for storing software programs and data structures associated with the embodiments described herein. In some embodiments, device 700 may have limited memory or no memory (e.g., no memory for storage other than for programs/processes operating on the device and associated caches).

Processor 720 comprises hardware elements or logic adapted to execute the software programs (e.g., instructions) and manipulate data structures 745. An operating system 742, portions of which are typically resident in memory 740 and executed by the processor, functionally organizes device 200 by, inter alia, invoking operations in support of software processes and/or services executing on the device. These software processes and/or services may include whole blade acquisition and phase correction processes/services 144, described herein. Note that while whole blade acquisition and phase correction processes/services 144 is illustrated in centralized memory 740, alternative embodiments provide for the process to be operated within the network interfaces 710, such as a component of a MAC layer, and/or as part of a distributed computing network environment.

It will be apparent to those skilled in the art that other processor and memory types, including various computer-readable media, may be used to store and execute program instructions pertaining to the techniques described herein. Also, while the description illustrates various processes, it is expressly contemplated that various processes may be embodied as modules or engines configured to operate in accordance with the techniques herein (e.g., according to the functionality of a similar process). In this context, the term module and engine may be interchangeable. In general, the term module or engine refers to model or an organization of interrelated software components/functions. Further, while the whole blade acquisition and phase correction processes/services 144 is shown as a standalone process, those skilled in the art will appreciate that this process may be executed as a routine or module within other processes.

It should be understood from the foregoing that, while particular embodiments have been illustrated and described, various modifications can be made thereto without departing from the spirit and scope of the invention as will be apparent to those skilled in the art. Such changes and modifications are within the scope and teachings of this invention as defined in the claims appended hereto.

The invention claimed is:

1. A method, comprising:
  accessing, by a processor in communication with a memory, a k-space blade echo signal sampled by a magnetic resonance device in communication with the processor, the k-space blade echo signal including a plurality of sub-blade echoes, the plurality of sub-blade echoes including a set of sub-blade echoes including a gradient-echo sub-blade echo and a spin-echo sub-blade echo;
  transforming, by the processor, each sub-blade echo individually into image space;
  accessing, by the processor, calibration data for each sub-blade echo of the plurality of sub-blade echoes;
  generating, by the processor, a plurality of phase maps by transformation of the calibration data into image space, the plurality of phase maps including:
    a gradient-echo phase map that corresponds to calibration data for the gradient-echo sub-blade echo; and
    a spin-echo phase map that corresponds to calibration data for the spin-echo sub-blade echo;
  generating, by the processor, a gradient-echo phase difference map
  that corresponds to a phase difference between the gradient-echo phase map and the spin-echo phase map of the plurality of phase maps;
  second and
  correct, by the processor, a phase of each gradient-echo sub-blade echo to align with the spin-echo sub-blade echo by removing the gradient-echo phase difference map from the gradient-echo sub-blade in image space.

2. A method, comprising:
  accessing, by a processor in communication with a memory, a k-space blade echo signal sampled by a magnetic resonance device in communication with the processor, the k-space blade echo signal including a plurality of sub-blade echoes, the plurality of sub-blade echoes including a plurality of odd sub-blade echoes including an odd spin-echo sub-blade echo and a plurality of even sub-blade echoes including an even spin-echo sub-blade echo;
  transforming, by the processor, each sub-blade echo of the plurality of sub-blade echoes individually into image space;
  generating, by the processor, a spin-echo phase difference map corresponding to a phase difference between the odd spin-echo sub-blade echo and the even spin-echo sub-blade echo in image space; and
  correcting, by the processor, a phase of a sub-blade echo of the plurality of sub-blade echoes to align with the even spin-echo sub-blade echo or the odd spin-echo sub-blade echo in image space by:
    removing the spin-echo phase difference map from each odd sub-blade echo of the plurality of sub-blade echoes in image space to align with the even spin-echo sub-blade echo; or
    removing the spin-echo phase difference map from each even sub-blade echo of the plurality of sub-blade echoes in image space to align with the odd spin-echo sub-blade echo.

3. A system, comprising:
  a processor in communication with a memory, the memory including instructions executable by the processor to:
    access a k-space blade echo signal by a magnetic resonance device in communication with the processor, the k-space blade echo signal including a plurality of sub-blade echoes, the plurality of sub-blade echoes including:
      a set of odd sub-blade echoes, the set of odd sub-blade echoes including a first odd gradient echo sub-blade echo, a second odd gradient echo sub-blade echo, and an odd spin-echo sub-blade echo; and
      a set of even sub-blade echoes, the set of even sub-blade echoes including a first even gradient echo sub-blade echo, a second even gradient echo sub-blade echo, and an even spin-echo sub-blade echo;
    transform each sampled sub-blade echo of the k-space blade echo signal individually into image space;
    correct a phase of each odd sub-blade echo to align with the odd spin-echo sub-blade echo in image space; and
    correct a phase of each even sub-blade echo of the set of even sub-blades echo to align with the even spin-echo sub-blade echo in image
    access calibration data for each sub-blade echo of the plurality of sub-blades of the k-space blade echo signal; and
    transform the calibration data into image space to generate:
      a set of odd sub-blade phase maps, the set of odd sub-blade phase data including a first odd gradient echo phase map, a second odd gradient echo phase map, and an odd spin-echo phase map; and
a set of even sub-blade phase maps, the set of even phase data including a first even gradient echo phase map, a second even gradient echo phase map, and an even spin-echo phase map.

4. The method of claim 2, further comprising:
applying, by the processor, a SENSE operation individually to each respective sub-blade echo of the plurality of sub-blade echoes of the k-space blade echo signal.

5. The method of claim 2, further comprising:
applying, by the processor, a GRAPPA calibration step to calibration data for each respective sub-blade echo of the plurality of sub-blade echoes; and
applying, by the processor, a GRAPPA synthetization step to each respective sub-blade echo of the plurality of sub-blade echoes of the k-space blade echo signal.

6. The method of claim 2, further comprising:
sampling, by the magnetic resonance device in communication with the processor, the k-space blade echo signal with Cartesian k-space sampling using a single-shot GRASE sequence; and
limiting, by the processor, a phase field of view of the magnetic resonance device in a phase encoding direction.

7. The method of claim 2, wherein the odd spin-echo blade echo and the even spin-echo blade echo of the k-space blade echo signal are collected at a center of k-space, wherein a first even gradient-echo sub-blade echo and a second even gradient-echo sub-blade echo of the plurality of even sub-blade echoes are each collected in k-space exterior to the odd spin-echo blade echo and the even spin-echo blade echo, and wherein a first odd gradient-echo sub-blade echo and a second odd gradient-echo sub-blade echo of the plurality of odd sub-blade echoes are each collected in k-space exterior to the first even gradient-echo sub-blade echo and the second even gradient-echo sub-blade echo.

8. The method of claim 2, wherein the plurality of odd sub-blade echoes are oriented orthogonal to the plurality of even sub-blade echoes.

9. The system of claim 3, the memory further including instructions executable 12y the processor to:
correct a phase of each odd sub-blade echo of the set of odd sub-blade echoes to align with the even spin-echo sub-blade echo in image space to generate a phase-corrected whole composite blade echo or correct a phase of each even sub-blade echo of the set of even sub-blade echoes to align with the odd spin-echo sub-blade echo in image space to generate a phase-corrected whole composite blade echo.

10. The system of claim 3, further comprising:
a magnetic resonance device, wherein the magnetic resonance device is configured to:
apply a magnetic resonance imaging pulse sequence to an object; and
sample a plurality of k-space blade echoes representative of magnetic resonance imaging echo data from the object, wherein the plurality of k-space blade echoes include a first k-space blade echo and a second k-space blade echo.

11. The system of claim 3, the memory further including instructions executable by the processor to:
collect first blade data from the first k-space blade echo in k-space, wherein k-space defines an inner center section and an outer concentric section;
collect second blade data from the second k-space blade echo in k-space;
combine second blade data from the outer concentric section of the second k-space blade echo with the first blade data of the first k-space blade echo.

12. The system of claim 3, wherein the odd spin-echo blade echo and the even spin-echo blade echo of the k-space blade echo are collected at the center of k-space, wherein the first even gradient-echo sub-blade echo and the second even gradient-echo sub-blade echo are each collected in k-space exterior to the odd spin-echo blade echo and the even spin-echo blade echo, and wherein the first odd gradient-echo sub-blade echo and the second odd gradient-echo sub-blade echo are each collected in k-space exterior to the first even gradient-echo sub-blade echo and the second even gradient-echo sub-blade echo.

13. The system of claim 3, wherein the set of odd sub-blade echoes are oriented in the same k-space as the set of even sub-blade echoes.

14. The system of claim 3, the memory further including instructions executable by the processor to:
transform each sub-blade echo of a plurality of sub-blade echoes of the phase-corrected whole composite blade echo individually from image space into k-space.

15. The system of claim 3, wherein the step of correcting the phase of each odd sub-blade echo to align with the odd spin-echo sub-blade echo in image space further comprises:
generating a set of odd phase difference maps including a first odd phase difference map and a second odd phase difference map;
wherein the first odd phase difference map corresponds to a phase difference between the first odd gradient echo phase map and the odd spin-echo phase map; and
wherein the second odd phase difference map corresponds to a phase difference between the second odd gradient echo phase map and the odd spin-echo phase map; and
removing the first odd phase difference map from the first odd gradient echo sub-blade in image space.

16. The system of claim 3, wherein the step of correcting the phase of each even sub-blade echo to align with the even spin-echo sub-blade echo in image space further comprises:
generating a set of even phase difference maps including a first even phase difference map and a second even phase difference map;
wherein the first even phase difference map corresponds to a phase difference between the first even gradient echo phase map and the even spin-echo phase map; and
wherein the second even phase difference map corresponds to a phase difference between the second even gradient echo phase map and the even spin-echo phase map; and
removing the first even phase difference map from the first even gradient echo sub-blade echo in image space.

17. The system of claim 9, wherein the step of correcting a phase of each odd sub-blade echo of the set of odd sub-blade echoes to align with the even spin-echo sub-blade echo in image space further comprises:
generating a spin-echo phase difference map corresponding to a phase difference between the odd spin-echo sub-blade echo and the even spin-echo sub-blade echo in image space; and
removing the spin-echo phase difference map from each odd sub-blade echo in image space.

18. The system of claim 9, wherein the step of correcting a phase of each even sub-blade of the set of even sub-blade echoes to align with the odd spin-echo sub-blade echo in image space further comprises:
  generating a spin-echo phase difference map corresponding to a phase difference between the odd spin-echo sub-blade echo and the even spin-echo sub-blade echo in image space; and
  removing the spin-echo phase difference map from each even sub-blade echo in image space.

19. The system of claim 3, wherein the set of odd sub-blade echoes are oriented orthogonal to the set of even sub-blade echoes.

20. The method of claim 1, further comprising:
  constructing, by the processor, a whole phase-corrected composite blade signal using the gradient-echo sub-blade echo and the spin-echo sub-blade echo following removal of the gradient-echo phase difference map from the gradient-echo sub-blade echo.

21. The method of claim 20, further comprising:
  converting, by the processor, the whole phase-corrected composite blade signal into a magnetic resonance image, where resonant frequencies resultant of application of a radiofrequency pulse sequence with magnetic field gradient by the magnetic resonance device are encoded within the whole phase-corrected composite blade and correspond with materials to be represented within the magnetic resonance image; and
  storing, by the processor, the magnetic resonance image at a memory in communication with the processor.

22. The method of claim 1, the gradient-echo phase difference map being an odd gradient-echo phase difference map that corresponds to a phase difference between an odd gradient-echo sub-blade echo and an odd spin-echo sub-blade echo of the plurality of sub-blade echoes.

23. The method of claim 1, the gradient-echo phase difference map being an even gradient-echo phase difference map that corresponds to a phase difference between an even gradient-echo sub-blade echo and an even spin-echo sub-blade echo of the plurality of sub-blade echoes.

24. The method of claim 1, the plurality of phase maps including an odd spin-echo phase map and an even spin-echo phase map, the method further comprising:
  generating, by the processor and using the odd spin-echo phase map and the even spin-echo phase map, a spin-echo phase difference map that corresponds to a phase difference between an odd spin-echo sub-blade echo and an even spin-echo sub-blade echo of the plurality of sub-blade echoes, the odd spin-echo sub-blade echo being oriented orthogonal to the even spin-echo sub-blade echo; and
  removing, by the processor, the spin-echo phase difference map from each sub-blade echo of the plurality of sub-blade echoes in image space;
  the odd spin-echo phase map corresponding to calibration data for an odd spin-echo sub-blade echo of the plurality of sub-blade echoes of the k-space blade echo signal; and
  the even spin-echo phase map corresponding to calibration data for an even spin-echo sub-blade echo of the plurality of sub-blade echoes of the k-space blade echo signal.

25. The method of claim 1, the gradient-echo phase difference map being a first gradient-echo phase difference map that corresponds to a phase difference between a first gradient-echo phase map and the spin-echo phase map of the plurality of phase maps, the first gradient-echo phase map corresponding to calibration data for a first gradient-echo sub-blade echo of the plurality of sub-blade echoes of the k-space blade echo signal.

26. The method of claim 25, the first gradient-echo sub-blade echo being a first odd gradient-echo sub-blade echo or a first even gradient-echo sub-blade echo of the k-space blade echo signal, the first odd gradient-echo sub-blade echo being oriented orthogonal to the first even gradient-echo sub-blade echo.

27. The method of claim 1, the gradient-echo phase difference map being a second gradient-echo phase difference map that corresponds to a phase difference between a second gradient-echo phase map and the spin-echo phase map of the plurality of phase maps, the second gradient-echo phase map corresponding to calibration data for a second gradient-echo sub-blade echo of the plurality of sub-blade echoes of the k-space blade echo signal.

28. The method of claim 27, the second gradient-echo sub-blade echo being a second odd gradient-echo sub-blade echo or a second even gradient-echo sub-blade echo of the k-space blade echo signal, the second odd gradient-echo sub-blade echo being oriented orthogonal to the second even gradient-echo sub-blade echo.

29. The method of claim 2, further comprising:
  constructing, by the processor, a whole phase-corrected composite blade signal using the plurality of odd sub-blade echoes and the plurality of even sub-blade echoes following phase correction of the plurality of sub-blade echoes.

30. The method of claim 29, further comprising:
  converting, by the processor, the whole phase-corrected composite blade signal into a magnetic resonance image, where resonant frequencies resultant of application of a radiofrequency pulse sequence with magnetic field gradient by the magnetic resonance device are encoded within the whole phase-corrected composite blade and correspond with materials to be represented within the magnetic resonance image; and
  storing, by the processor, the magnetic resonance image at a memory in communication with the processor.

* * * * *